(12) United States Patent
Partlo et al.

(10) Patent No.: US 6,317,447 B1
(45) Date of Patent: Nov. 13, 2001

(54) ELECTRIC DISCHARGE LASER WITH ACOUSTIC CHIRP CORRECTION

(75) Inventors: William N. Partlo, Poway; Igor V. Fomenkov, San Diego; Jean-Marc Hueber, La Jolla, all of CA (US); Zsolt Bor, Szeged (HU); Eckehard D. Onkels, San Diego, CA (US); Michael C. Cates, Escondido, CA (US); Richard C. Ujazdowski, San Diego, CA (US); Vladimir B. Fleurov, Escondido, CA (US); Dmitri V. Gaidarenko, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/490,835

(22) Filed: Jan. 25, 2000

(51) Int. Cl.⁷ .................................................. H01S 3/22
(52) U.S. Cl. .................. 372/57; 372/58; 372/34
(58) Field of Search .................. 372/58, 57, 34

(56) References Cited

U.S. PATENT DOCUMENTS

| | | | |
|---|---|---|---|
| 4,205,732 | * 6/1980 | Auerbach et al. | 181/230 |
| 5,852,621 | 12/1998 | Sandstrom | 372/25 |
| 5,978,405 | * 11/1999 | Juhasz et al. | 372/57 |
| 5,991,324 | * 11/1999 | Knowles et al. | 372/57 |
| 6,005,879 | 12/1999 | Sandstrom et al. | 372/25 |
| 6,034,978 | * 3/2000 | Ujazdowski et al. | 372/34 |
| 6,128,323 | * 10/2000 | Myers et al. | 372/38 |

* cited by examiner

Primary Examiner—Teresa M. Arroyo
Assistant Examiner—Davienne Monbleau
(74) Attorney, Agent, or Firm—John R. Ross, Esq.

(57) ABSTRACT

Methods and structural changes in gas discharge lasers for minimizing wavelength chirp at high pulse rates. Applicants have identified the major cause of wavelength chirp in high pulse rate gas discharge lithography lasers as pressure waves from a discharge reflecting back to the discharge region coincident with a subsequent discharge. The timing of the arrival of the pressure wave is determined by the temperature of the laser gas through which the wave is traveling. During burst mode operation, the laser gas temperature in prior art lasers changes by several degrees over periods of a few milliseconds. These changing temperatures change the location of the coincident pressure waves from pulse to pulse within the discharge region causing a variation in the pressure of the laser gas which in turn affects the index of refraction of the discharge region causing the laser beam exiting the rear of the laser to slightly change direction. This change in beam direction causes the grating in the LNP to reflect back to the discharge region light at a slightly different wavelength causing the wavelength chirp. Solution to the problem is to include in the laser chamber structural elements to moderate or disperse the pressure waves and to maintain the laser gas temperature as close as feasible to constant values.

9 Claims, 21 Drawing Sheets

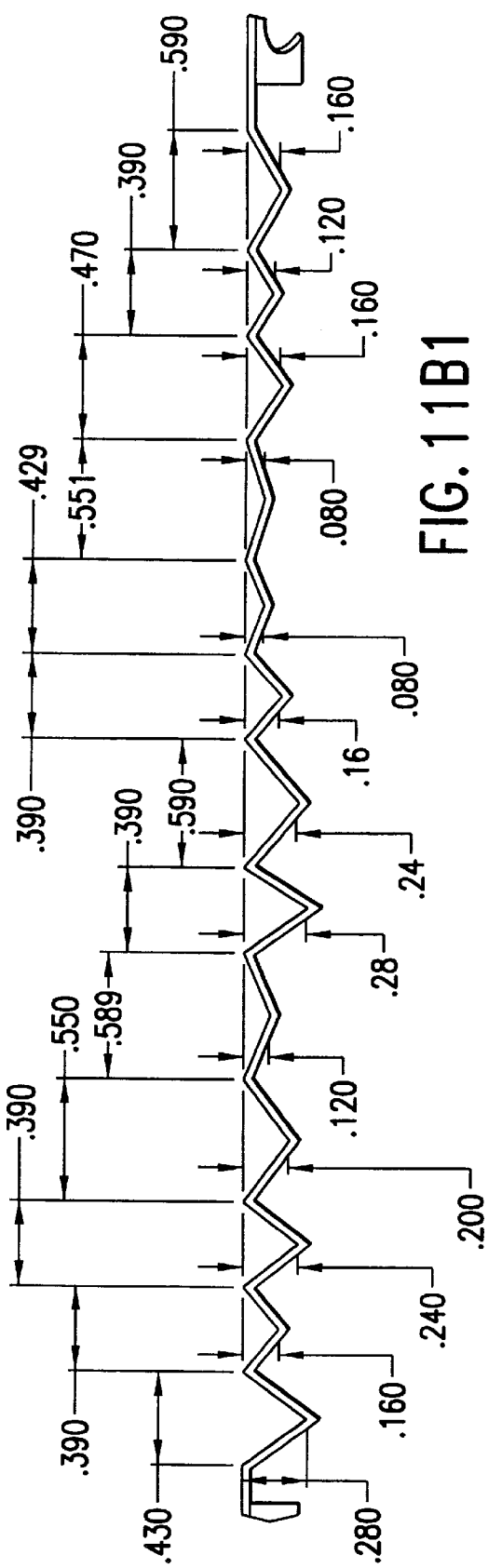
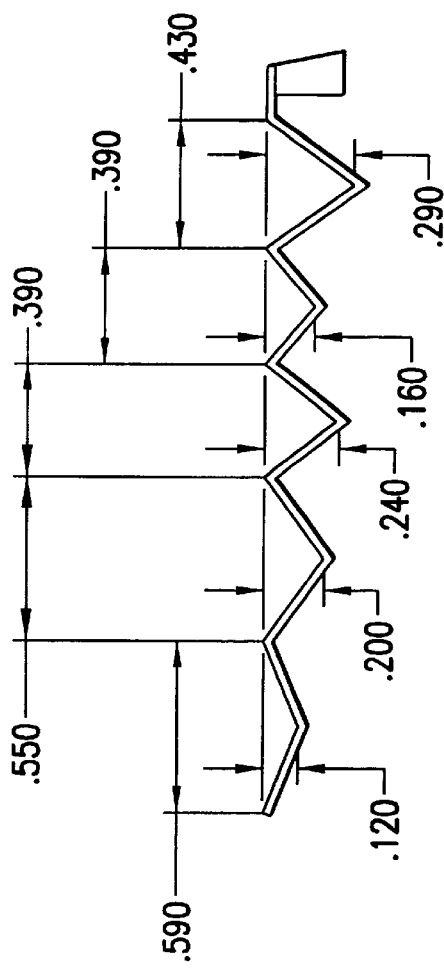
FIG. 11B1
FIG. 11B2

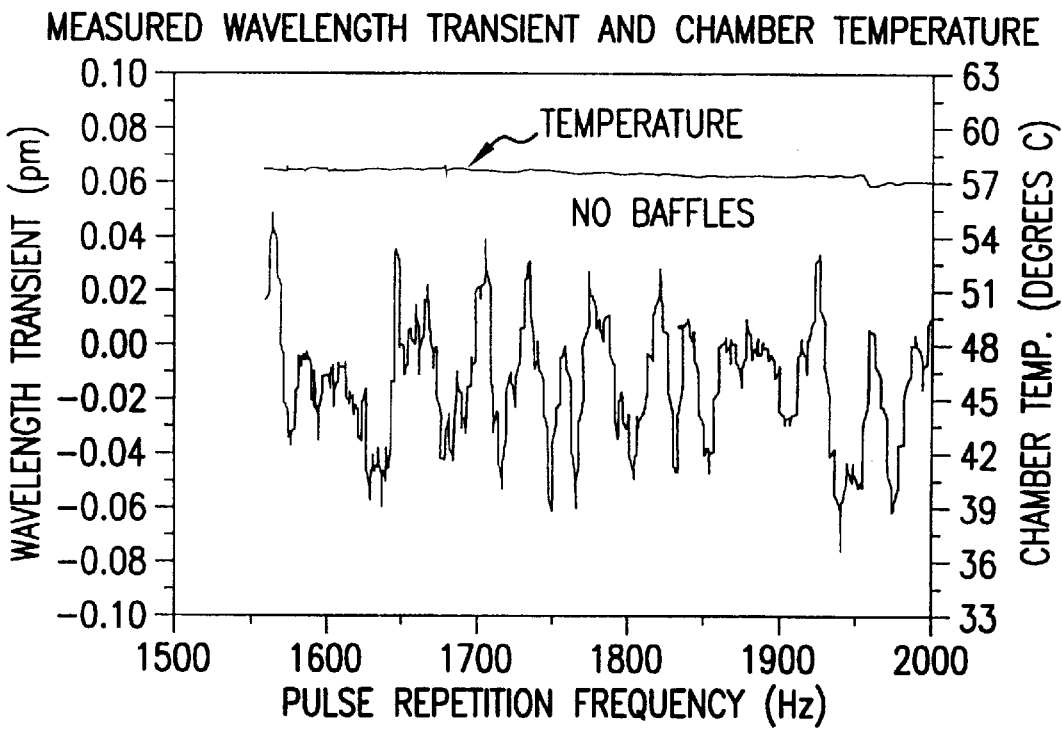
FIG.11C1
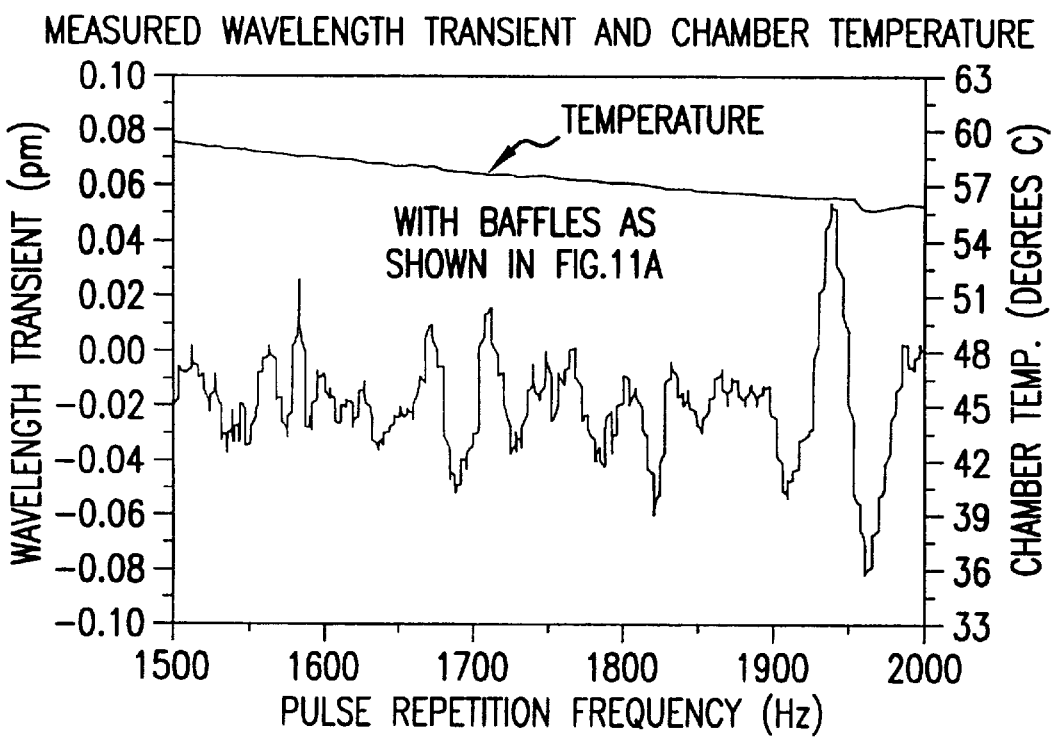
FIG.11C2

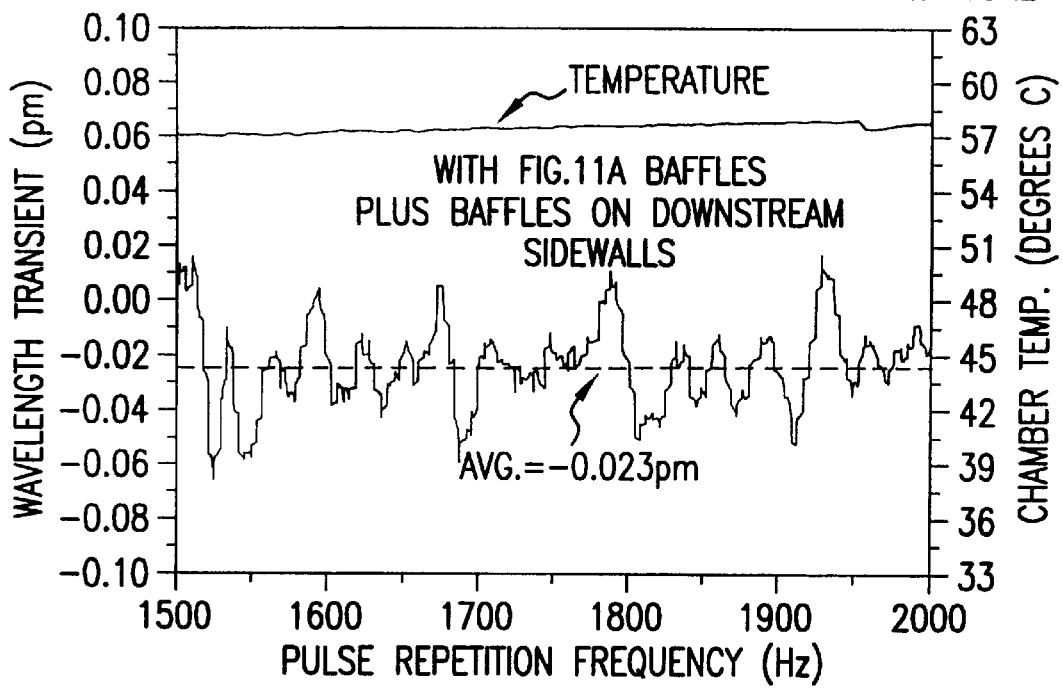
FIG.11C3
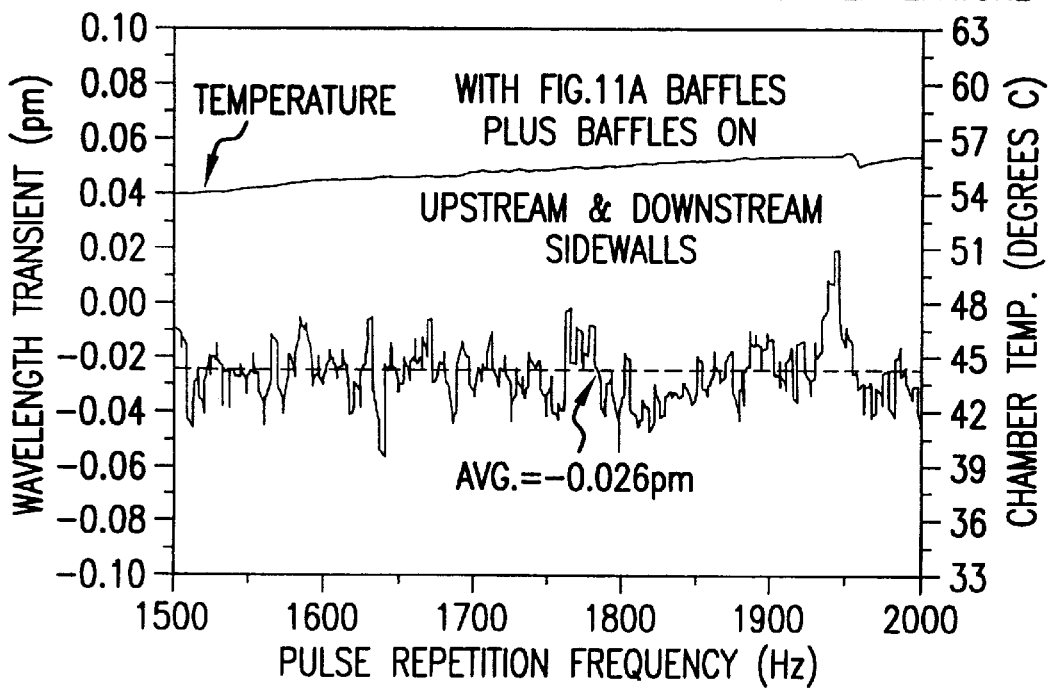
FIG.11C4

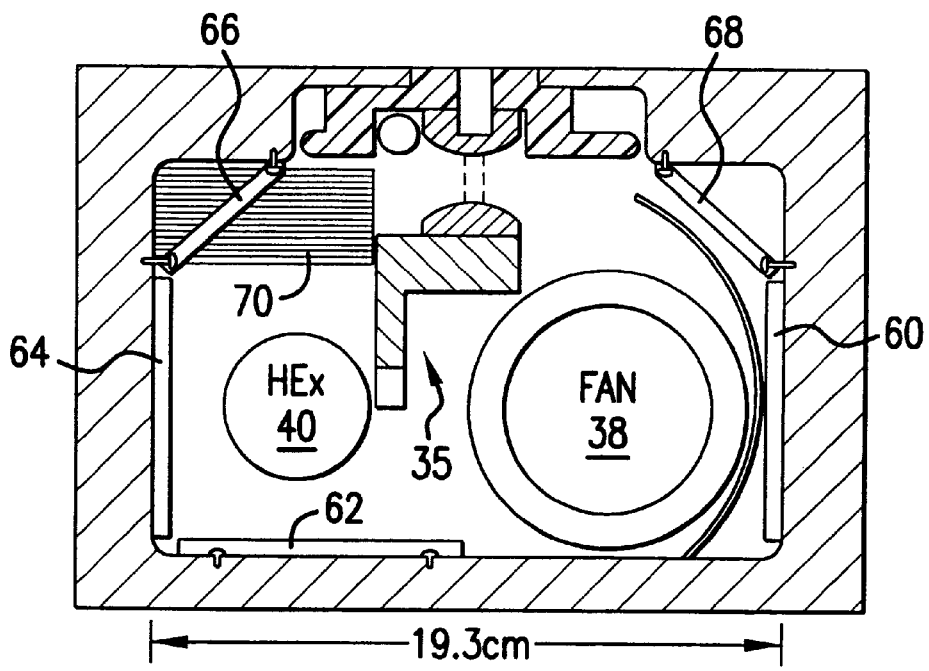
FIG.11D1
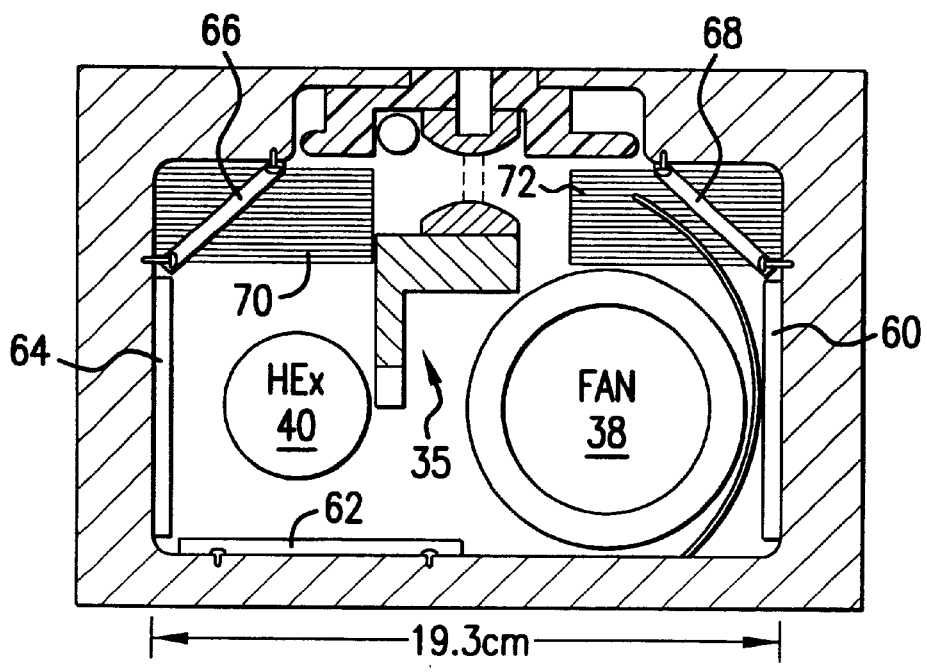
FIG.11D2

ELECTRIC DISCHARGE LASER WITH ACOUSTIC CHIRP CORRECTION

The present invention relates to laser discharge chambers and in particular to chambers having provisions for correction of acoustic disturbances.

BACKGROUND OF THE INVENTION

It is known that the discharge in electric discharge laser chambers can cause pressure wave disturbances that interfere with subsequent pulses. Laser chambers with provisions for minimizing these disturbances are described in U.S. Pat. No. 5,978,405 which is incorporated herein. The '405 patent is assigned to the assignee of the present invention. FIG. 1 is a drawing of the cross section of a typical KrF excimer laser chamber. The gain region of the laser is a discharge region with a cross section of about 20 mm×4 mm shown as 34 in FIG. 1 with a length between elongated electrodes 36A and 36B of about 70 cm. In the chamber laser gas is circulated by fan 38 and cooled by heat exchanger 40. Also shown in FIG. 1 are main insulator 42, anode support bar 44 and preionizer rod 46.

An important use of electric discharge lasers such as KrF excimer lasers is as light sources for integrated circuit lithography. In these applications, the lasers are line narrowed to about 0.5 pm about a desired "center-line" wavelength. The laser beam is focused by a stepper or scanner machine onto the surface of a silicon wafer on which the integrated circuits are being created. The surface is illuminated with short bursts of laser pulses at pulse rates of about 1000 Hz or greater. Very precise control of wavelength and bandwidth are required to permit the production of extremely fine integrated circuit features. The operators of most stepper and scanner machines in use today operate the laser light source at about 1000 Hz, but 2000 Hz sources are being shipped and lasers with even higher repetition rates are being developed. The typical laser gas for the KrF laser is about 99 percent neon at 3 atmospheres and at a temperature of about 45° C. At this temperature a sound wave travels about 47 cm between pulses at 1000 Hz, about 23.5 cm between pules at 2000 Hz and about 11.7 cm at 4000 Hz. Integrated circuit manufacturers desire to be able to operate their laser at any pulse rate within the operating range of the laser while maintaining beam parameters including target wavelength and bandwidth within desired specifications.

Distances between the discharge region of a typical lithography excimer laser and major reflecting surfaces within the laser chamber range from about 5 to 20 cm. Distances between reflecting surfaces in planes perpendicular to the length of the discharge region are mostly between about 5 cm to about 10 cm. Therefore, as demonstrated by a comparison of FIG. 2A showing distances traveled by sound with FIG. 1, a typical discharge created pressure wave traveling at the speed of sound in the FIG. 1 laser operating at 1000 Hz would have to make several reflections in order to arrive back at the discharge region coincident with the next discharge. At pulse rates in the range of 2000 Hz and higher, the pressure wave traveling at the speed of sound may return to the discharge region coincident with the next pulse after only one reflection.

Wavelength Specifications For Lithography Lasers

KrF excimer lasers currently in use for integrated circuit lithography are designed for precise control of wavelength and bandwidth. Current specifications from integrated circuit makers call for control of the target wavelength to a target wavelength, such as 248,321.3 pm within a stability range of ±0.1 pm. A typical bandwidth specification may be 0.6 pm, full width half maximum and 3 pm, 95% integral.

The makers of stepper and scanner machines want to tighten these specifications and also to increase pulse repetition rate to 2000 Hz and above.

A typical method of line narrowing a lithography laser is shown in FIG. 3. In this drawing the line narrowing module (called a "line narrowing package" or "LNP") 7 is greatly enlarged with respect to the rest of laser system 2. The laser beam exiting back end of laser chamber 3 is expanded with a three prism beam expander 18, and reflected by a tuning mirror 14 on to a grating 16 disposed in the Litrow configuration. The angle at which the light illuminates and is reflected from the surface of the grating determines the selected wavelength. For example, in this prior art laser a pivot of 40 micro radians produced by stepper motor 15 will change the wavelength of the selected light by 1 pm. The three prism beam expander shown in FIG. 3 increases the selectivity of the grating by its magnification factor which is typically about 25. A change in direction of the beam exiting the laser in the direction of the LNP can also cause a change in the wavelength selected by the grating; however, the direction change would need to be about 1 milliradian to cause a 1 pm change in the selected wavelength.

Prior art KrF excimer lasers can be operated within very tight specifications even at very high repetition rates when operating at steady state, for example, continuously at 2000 Hz. However, typical operating modes for a lithography laser light source is far from steady state continuous. In a typical mode, 170 dies on a wafer may each be illuminated with 0.15 second bursts of laser pulses at a pulse repetition rate of 2000 Hz (i.e., 300 10-mJ pulses) with a 0.15 second down time between bursts and then a 9 second down time while a new wafer is loaded onto the machine. This complete cycle would take about 1 minute and would represent a duty cycle of about 42.5 percent.

Lasers operating in burst modes at pulse repetition rates in the range of 1000 Hz or greater have displayed patterns of wavelength variation. These variations are referred to as wavelength "chirp" and to date their cause has not been known. The chirp tends to increase with increasing repetition rate.

What is needed is an electric discharge laser having provisions for minimizing acoustic disturbances at pulse rates in excess of 1000 Hz sufficiently to permit beam parameters to be maintained within desired specifications.

SUMMARY OF THE INVENTION

The present invention provides structural changes and methods for minimizing wavelength chirp in high pulse rate gas discharge lasers. Applicants have identified the major cause of wavelength chirp as pressure waves from a discharge reflecting back to the discharge region coincident with a subsequent discharge. The timing of the arrival of the pressure wave is determined by the temperature of the laser gas through which the wave is traveling. During burst mode operation, the laser gas temperature in prior art lasers changes by several degrees over periods of a few milliseconds. These changing temperatures change the location of the coincident pressure waves from pulse to pulse within the discharge region causing a variation in the pressure of the laser gas which in turn affects the index of refraction of the discharge region causing the laser beam exiting the rear of the laser to slightly change direction. This change in beam direction causes the grating in the LNP to reflect back to the discharge region light at a slightly different wavelength causing the wavelength chirp.

Two solutions to the chirp problem described in this specification is to moderate or disperse the discharge created pressure waves or to maintain the gas temperature as close as feasible to constant values (pulse-to-pulse).

In a preferred embodiment an acoustic baffle, comprised of sheet metal, preferably nickel plated aluminum, formed to produce a saw-tooth shaped surface with varying saw-teeth shapes, lining the laser chamber walls disperses the pressure waves. In this embodiment the ridges of the baffle are aligned generally with the gas flow path so that the pressure waves are dispersed in a very large number of directions other than perpendicular to the discharge direction. In another preferred embodiment the saw-teethed shaped baffle is made of perforated sheet metal so that the pressure waves are absorbed and dispersed.

In another preferred embodiment, aluminum oxide fibers are positioned in the chamber to absorb and disperse the pressure wave.

BRIEF DESCRIPTION OF THE DRAWINGS

FIGS. 11A, 11B, 11B1, 11B2, 11D1 and 11D2 show details of saw-tooth baffle technique for dispersing pressure waves.

FIGS. 11C1 through 11C4 show the effects of the baffle technique.

DETAILED DESCRIPTION OF PREFERRED EMBODIMENTS

Applicants' Experiments

Applicants suspected that wavelength chirp was caused by changes in laser gas temperature which in turn affected the speed at which pressure waves traveled through the laser chamber and thus the timing of the return of reflected pressure waves to the discharge region.

To test this theory Applicants operated a laser at a very low duty cycle mode (100-pulse at 2000 Hz followed by 5 seconds off) with the chamber water lines disconnected and the chamber heater disabled. Both the cooling water and heater were disabled to allow slow and uniform changing of the chamber temperature. The chamber temperature was controlled by changing the room temperature and by placing a floor fan several feet from the frame. The power imparted to the gas by the blower provided sufficient heat to warm the chamber as high as 60° C. and the floor fan provided sufficient cooling to drop the chamber temperature to 39° C. The heating and cooling of the chamber took place over a period of several hours in order to minimize any effects due to dT/dt.

From data collected the average energy for a burst, the energy variation for a burst, the wavelength burst transient, and the standard deviation of the line-center variation (called "wavelength sigma") were calculated. To provide a single data point able to quantify the line-center burst transient, a "wavelength burst transient" was defined as the difference between the average line-center wavelength of the first 30 pulses and the average line-center wavelength of the last 30 pulses in each burst. Since the wavemeter of the laser used provided data at 1000 Hz, these averages consist of only 15 unique wavelength transient values. The average of the last 30 pulses was used as a measure of the steady state line-center wavelength.

The chamber temperature was allowed to slowly vary between its extremes of about 40° C. to about 55° C. while the parameters described above were continuously monitored. All four of the measured parameters changed substantially as the chamber temperature decreased. Pulse energy generally decreased (with some small up and down variation) with decreasing temperature but the other three parameters increased and decreased substantially over the temperature range.

Figure 4A:
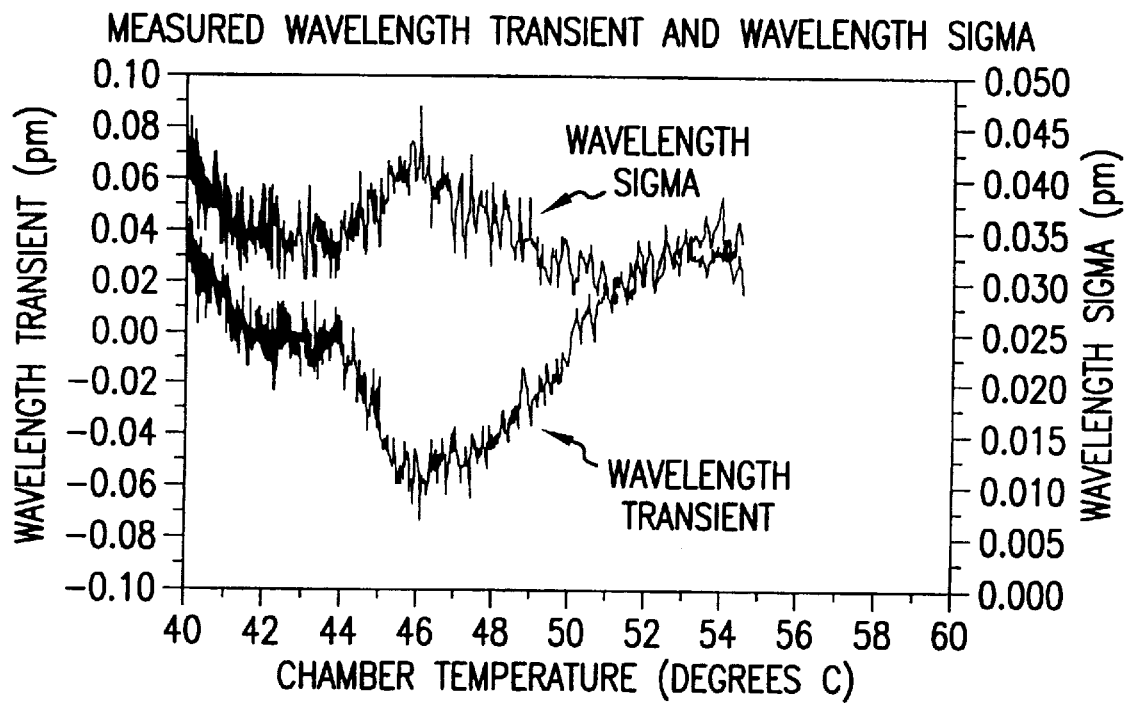
FIGS. 4A and 4B show variation of wavelength sigma and wavelength transient with laser gas temperature.
Figure 4B:
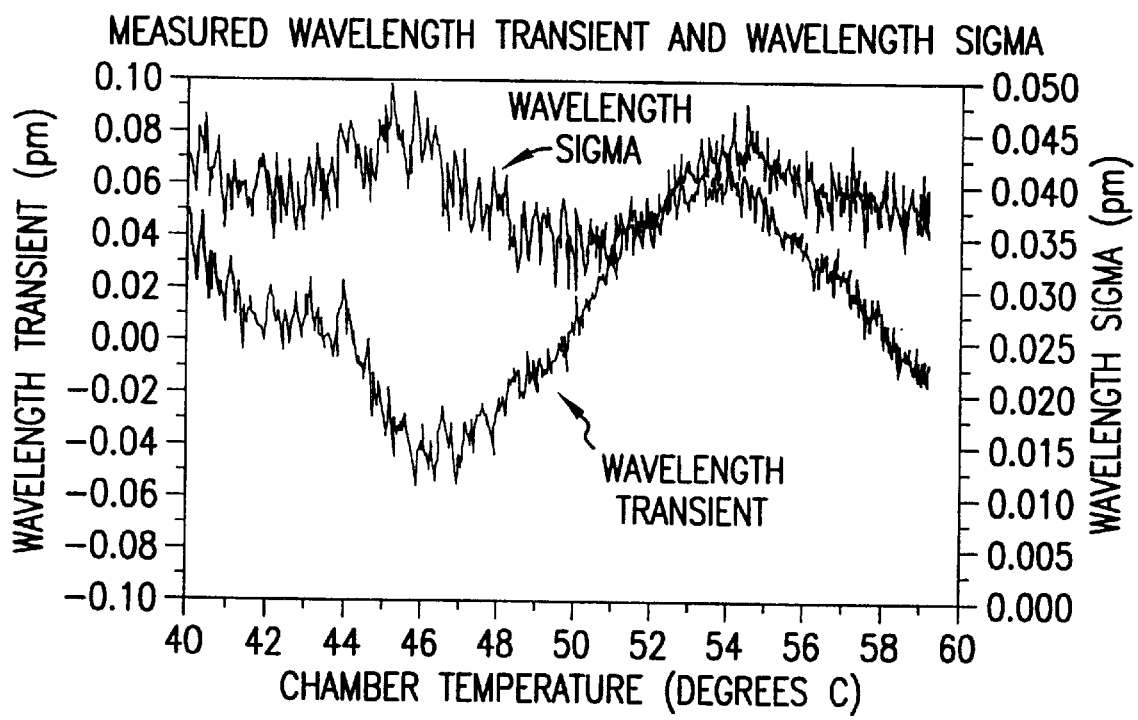
Figure 5A:
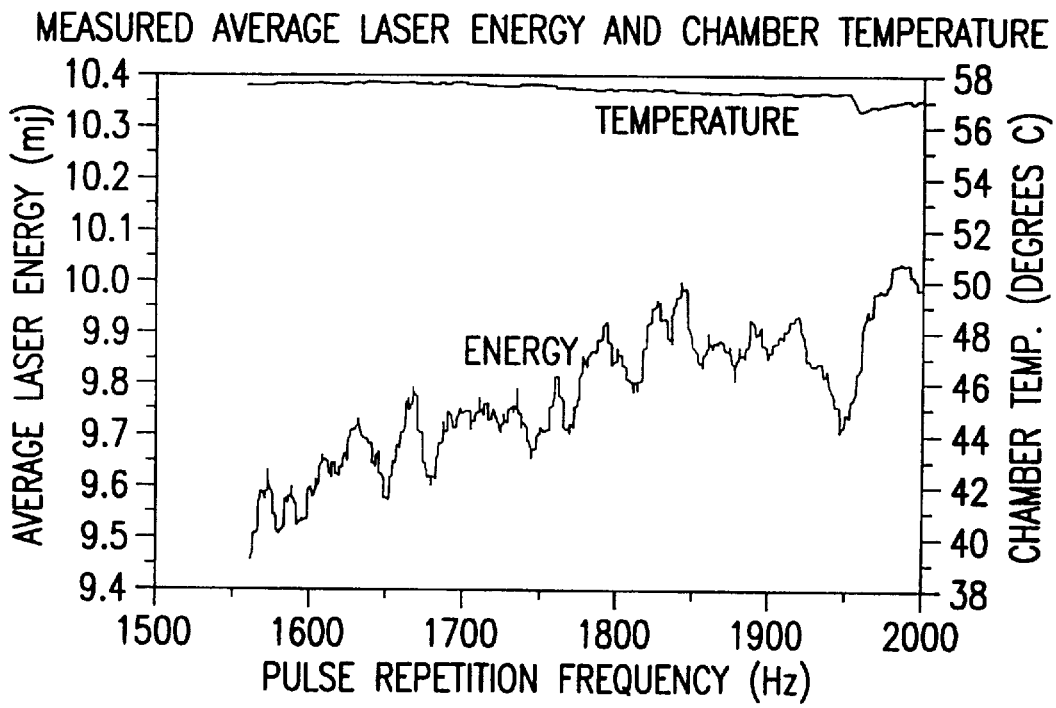
FIGS. 5A through 8B show variation of beam parameters with pulse repetition rate at two substantially different temperatures.
Figure 5B:
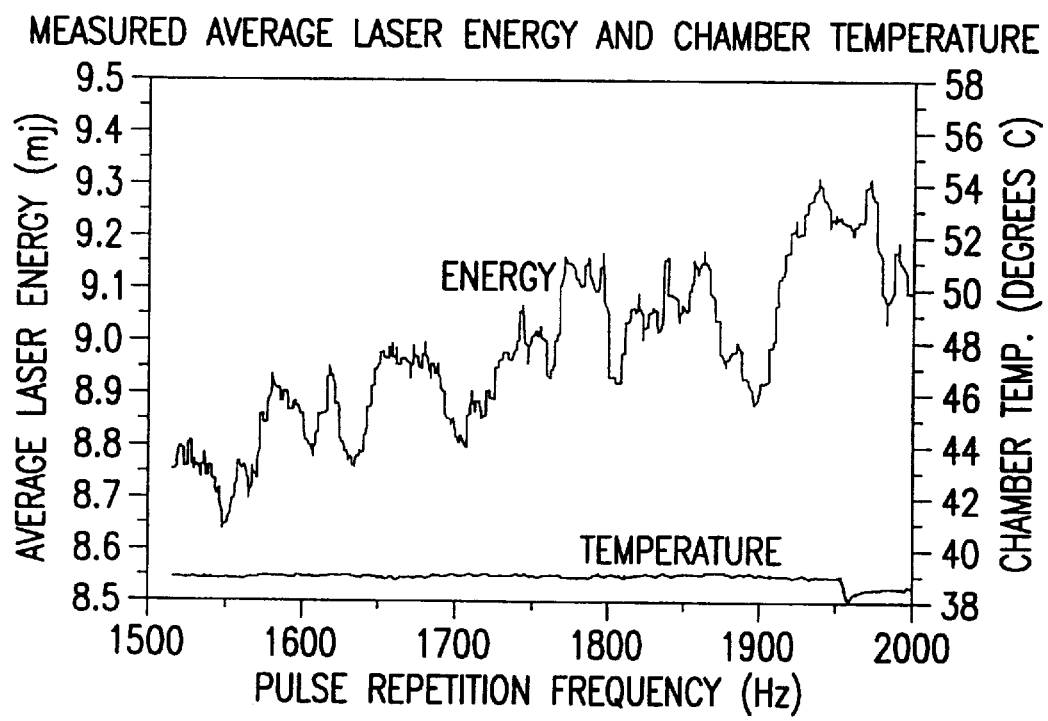
Figure 6A:
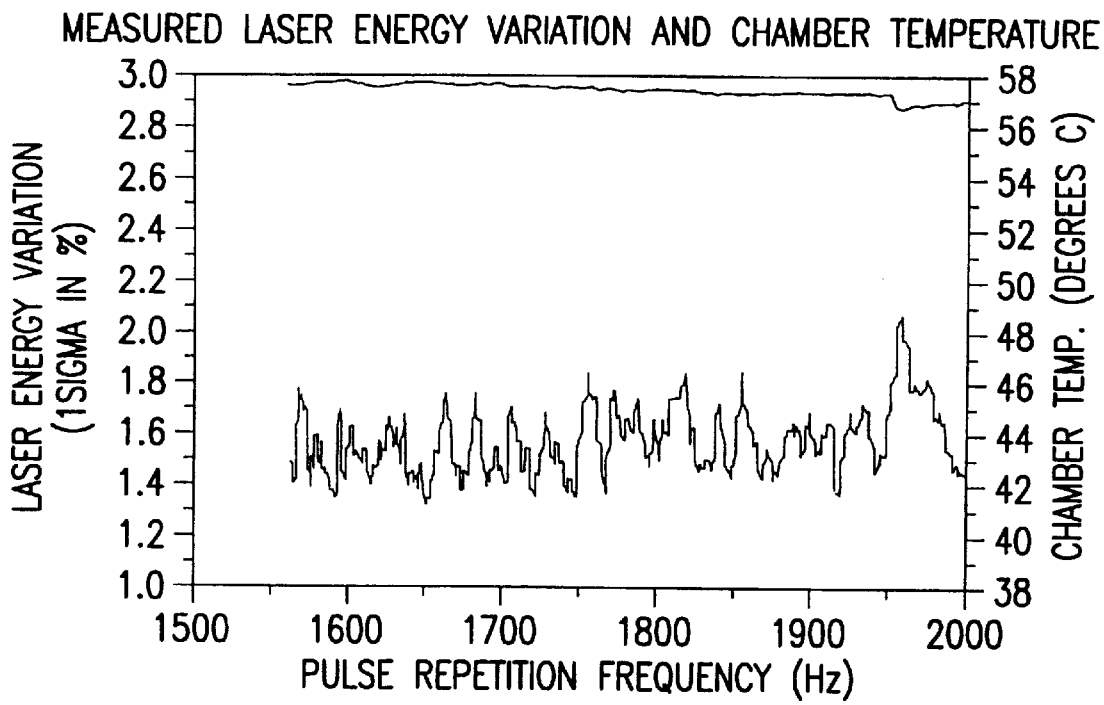
Figure 6B:
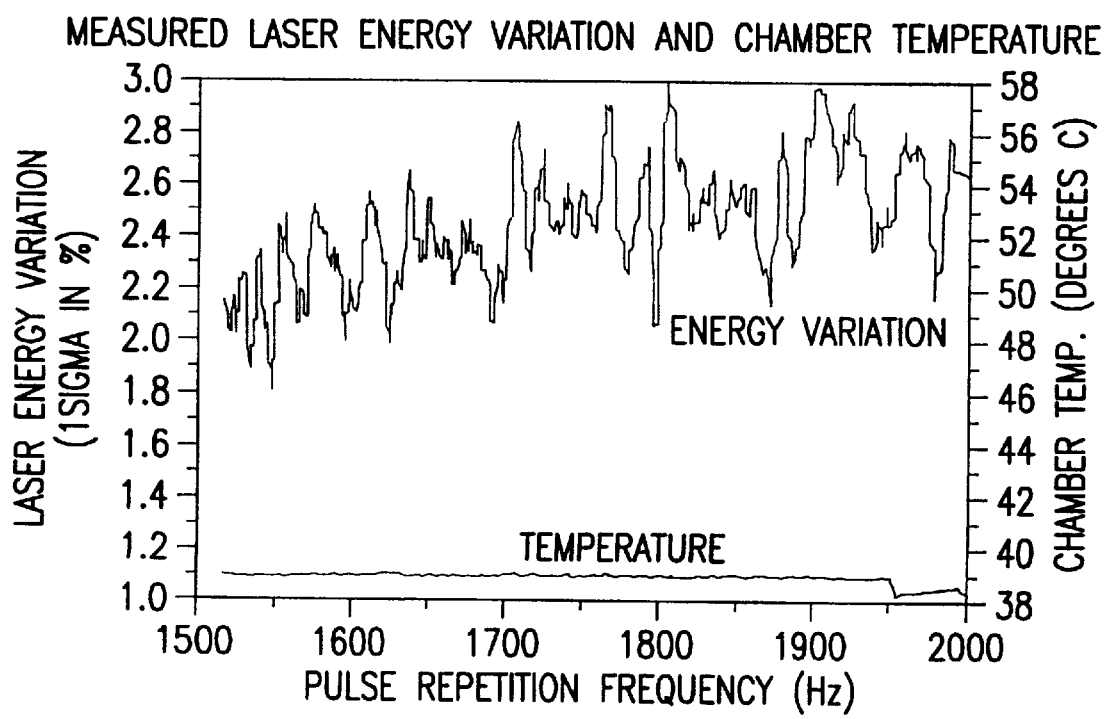

By plotting wavelength burst transient and wavelength sigma vs. chamber temperature we see that these characteristics vary with chamber temperature in a stable and repeatable manner. FIG. 4A shows the data taken during cool down and FIG. 4B shows the data taken during warm up.

Once a temperature sensitivity had been established with repeatable measurement results, the next question to answer was, in what way does chamber temperature impact wavelength transient? Variations with temperature on this order have been found in the past with other laser parameters, most notably laser energy. If wavelength transient is impacted in similar ways as the laser energy, then acoustic effects might be a significant factor. Since the speed of sound in a gas depends on the square root of temperature, a display of this type of relationship would indicate an acoustical cause.

Applicants then operated the laser over a range of laser repetition rates at two substantially difference chamber temperatures and compared the resulting curves.

The same four parameters as before were measured versus repetition rate and are shown for a high temperature of approximately 57° C. in FIGS. 5A, 6A, 7A and 8A. The lower temperature data is shown in FIGS. 5B, 6B, 7B and 8B for a temperature of approximately 39° C. Each of the figures show a rich structure and variations with repetition rate and a few Hz can lead to significant changes in plotted parameters.

Figure 7A:
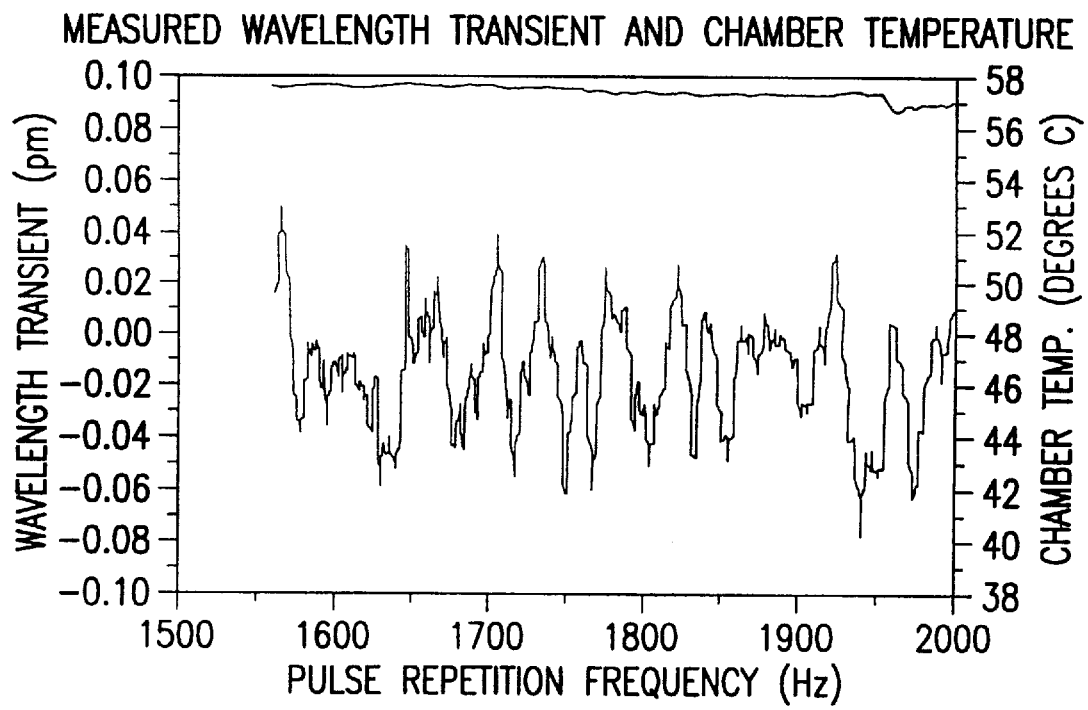
Figure 7B:
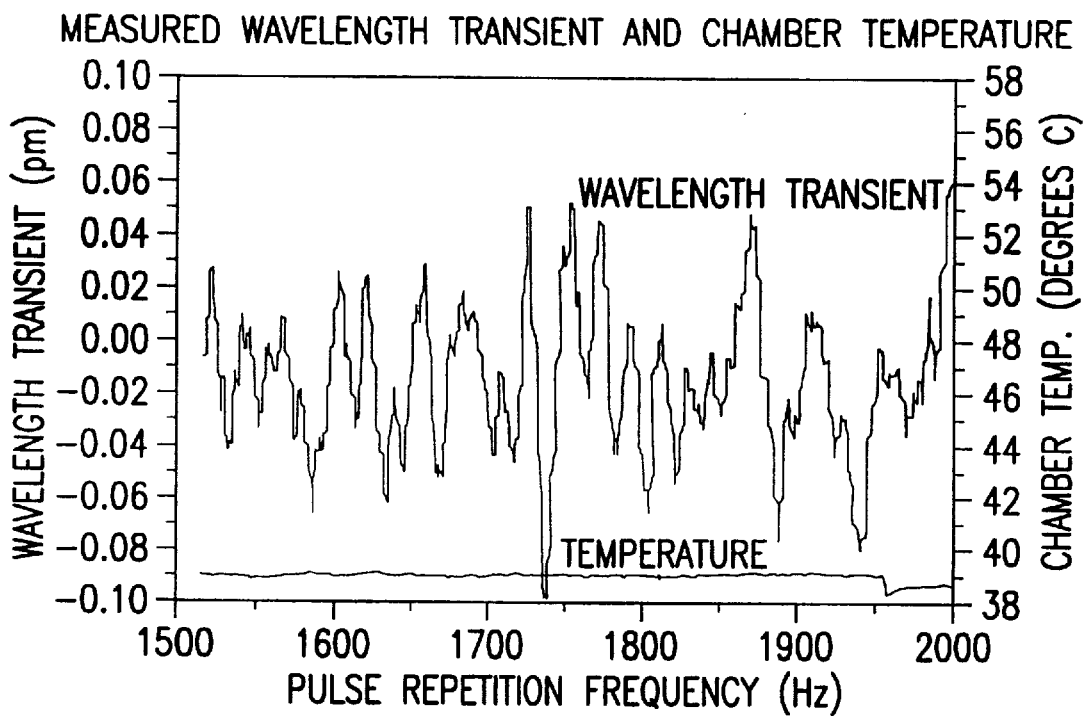
Figure 8A:
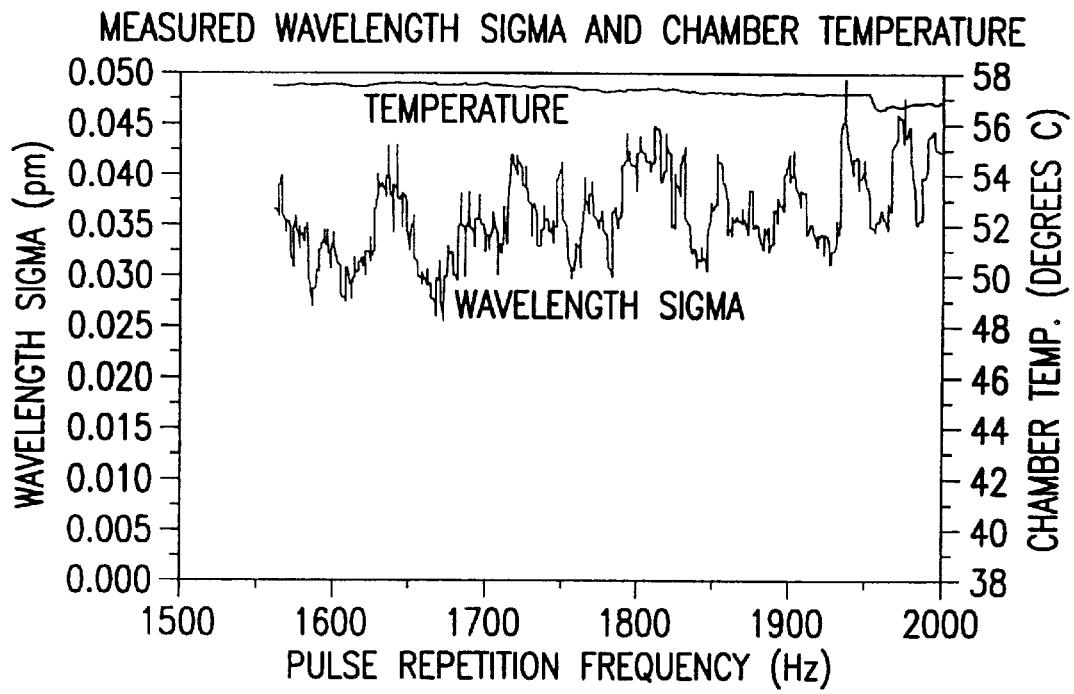
Figure 8B:
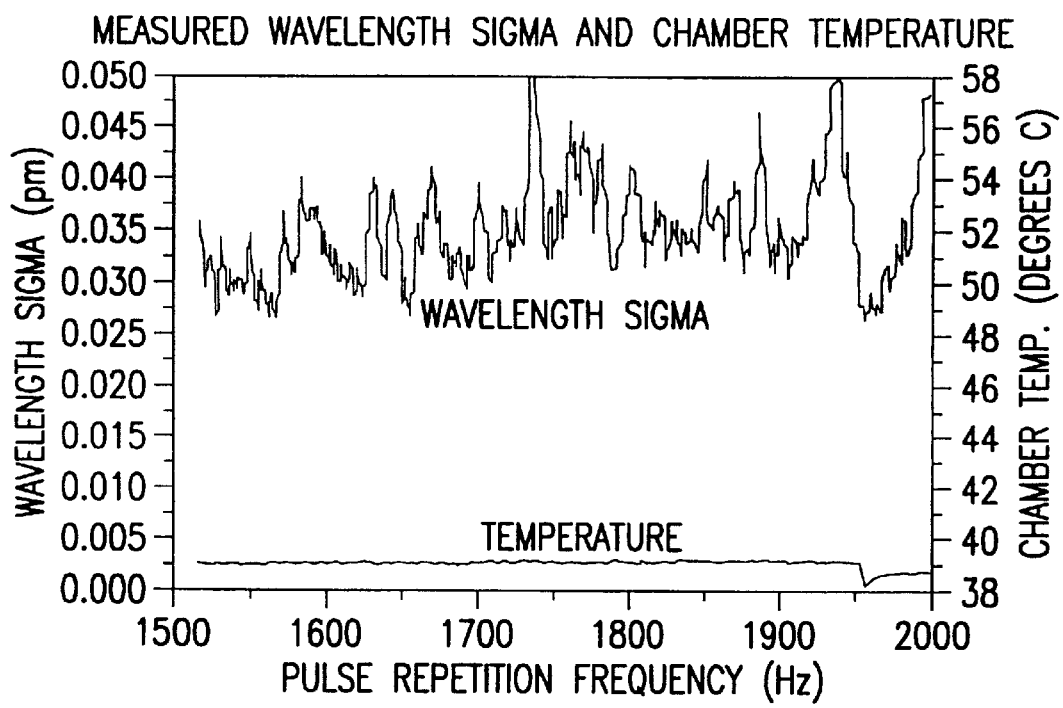
Figure 9A:
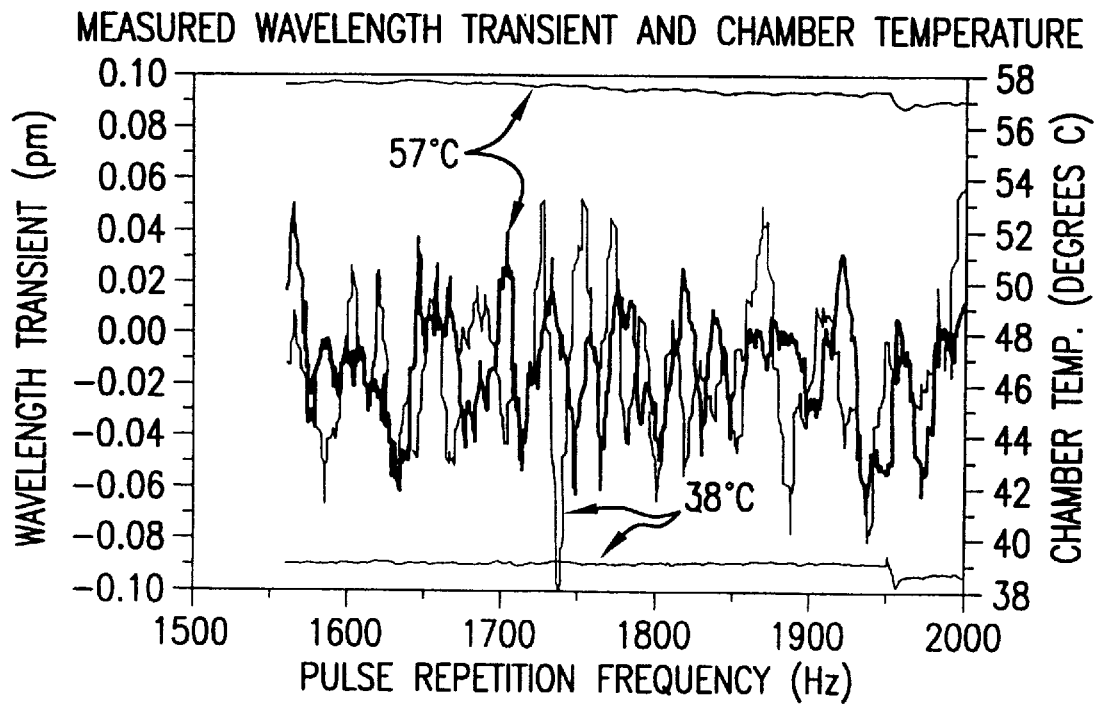
FIGS. 9A and 9B compare wavelength transient versus pulse repetition rate curves at the two different temperatures.

To see if these variations with repetition rate are acoustic related the data could be plotted with the lower temperature data shifted appropriately. But first Applicants plotted the two data sets together with no shifting. FIG. 9A shows FIGS. 7A and 7B plotted together (the thicker plot representing the 57° data. The result is no apparent correlation.

Figure 9B:
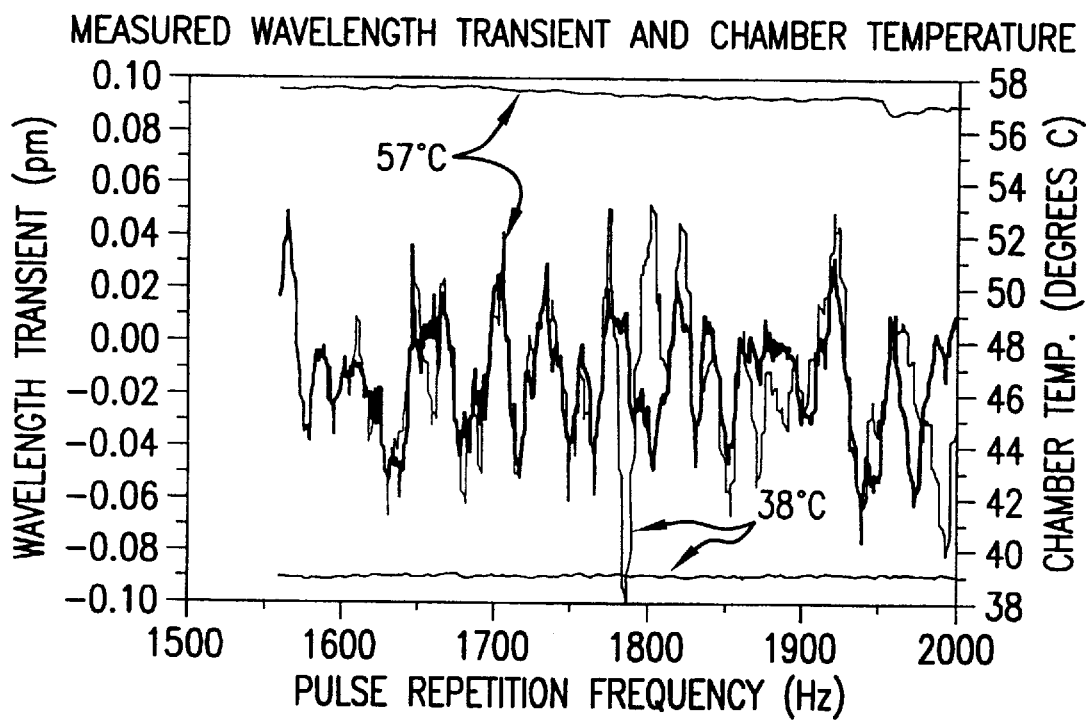

The comparison after making the shift due to the difference in the speed of sound is as shown in FIG. 9B. This was done by plotting the 39° C. data at repetition rates increased by the ratio of.

$$\frac{\sqrt{330K}}{\sqrt{312K}}$$

The shift for temperature is actually quite small, only 2.8%, but when applied to the lower temperature data virtually all of the structure matches between the two data sets. There are only three significant peaks that differ between the two sets. These features may be due to another phenomenon or they are still may be acoustical but are due to a coincident combinations of several reflections from different distances that occur at one temperature but do not at the other.

The data presented in FIGS. 4A through 9B show that the wavelength transient occurring at the beginning of a burst can be dramatically impacted by acoustic interaction with the chamber. This data also shows that it might be difficult to attempt to find a "sweet spot" for low transient since only a few degrees of temperature change or a few Hz of repetition rate change cause a large shift in the transient. The situation becomes even more complicated when the heat exchanger and chamber heater are active, creating spatial temperature gradients and fast dT/dt events.

Temperature Variation During Burst Mode Operation

During the second half of a 300 pulse burst the laser is close to steady state conditions, but during the first approximately 60 pulses of each burst the condition of the laser is far from steady state. The discharge region between the electrodes 10 and 12 is a volume about 20 mm high 4 mm high and 80 cm long. During a discharge about 2J of electrical energy is deposited in this volume of gas which is about 99% neon at 3 atmospheres at an initial temperature of, for example, about 50° C. The discharge occurs in a very short time period of about 40 ns which initiates a violent pressure wave which travels out at about the speed of sound (about 470 m/s) from the discharge region through the circulating gas.

The 2J of energy also increases the temperature of a slug of gas in the immediate vicinity of the discharge which move slowly out of the discharge region at the speed of the circulating gas, about 40 m/s. The heated slug is initially about the size of the discharge volume and it expands relatively slowly. The relatively slowly expanding slug of heated gas is pushed out from between the electrodes by the circulating gas so that, with the laser operating at 2 kHz, the heated slug from a given pulse is centered about 2 cm downstream of the electrode a s shown at 20 in FIG. 1A at the time of the next pulse.

Figure 1:
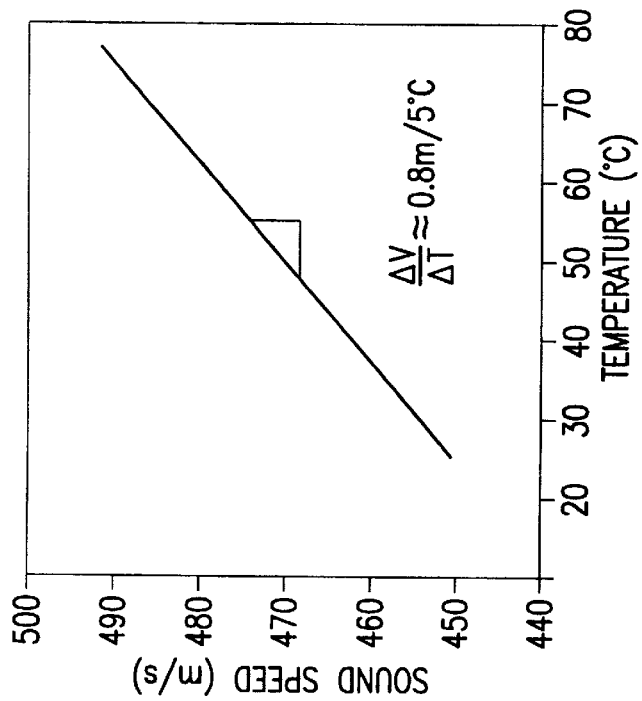
FIG. 1 shows the cross section a prior art lithography laser chamber.

At typical blower speeds for a 2 kHz lithography laser such as the one shown in FIG. 1, the laser gas makes a complete loop around the chamber in about 30 milliseconds. For a one minute, 42.5 percent duty cycle of the type described above (i.e., 170 short bursts of 300 pulses at 2000 Hz followed by a 9 second down time), the discharge will be adding heat to the gas at an average rate of about 1.7 kw (about 2J per pulse). The fan adds heat at a substantially constant rate of about 500 W and the heat exchanger removes the large majority of the heat added by the discharge and the fan at an approximately constant rate over the 1-minute duty cycle.

Figure 1A:
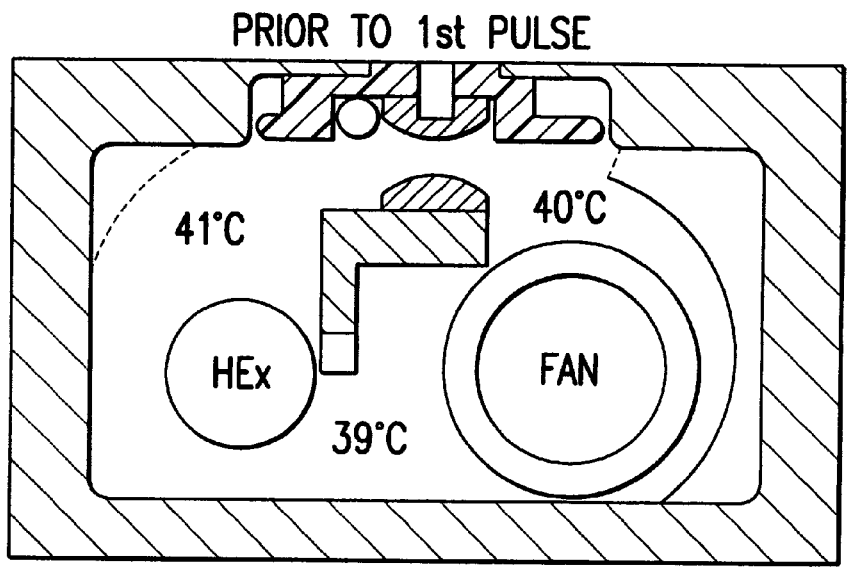
FIGS. 1A through 1F show temperature changes in the laser gas during a burst of pulses.
Figure 1B:
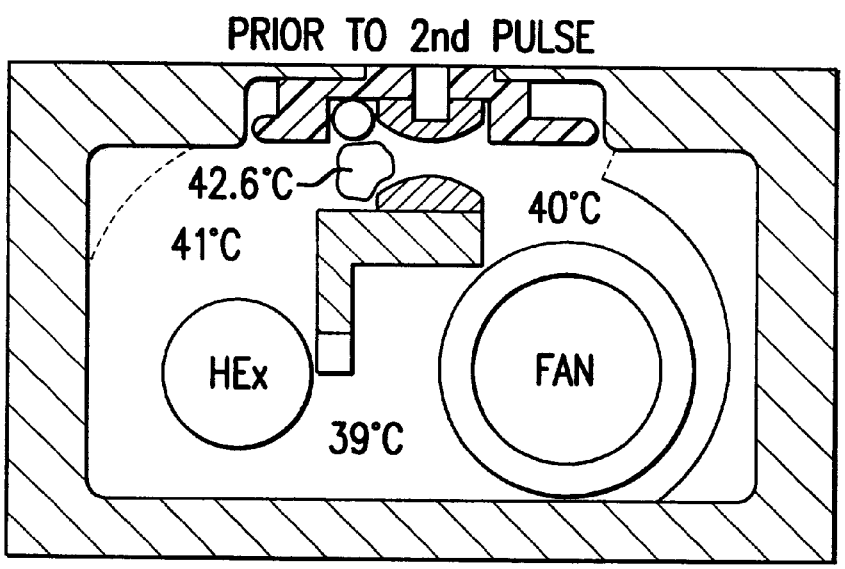
Figure 1C:
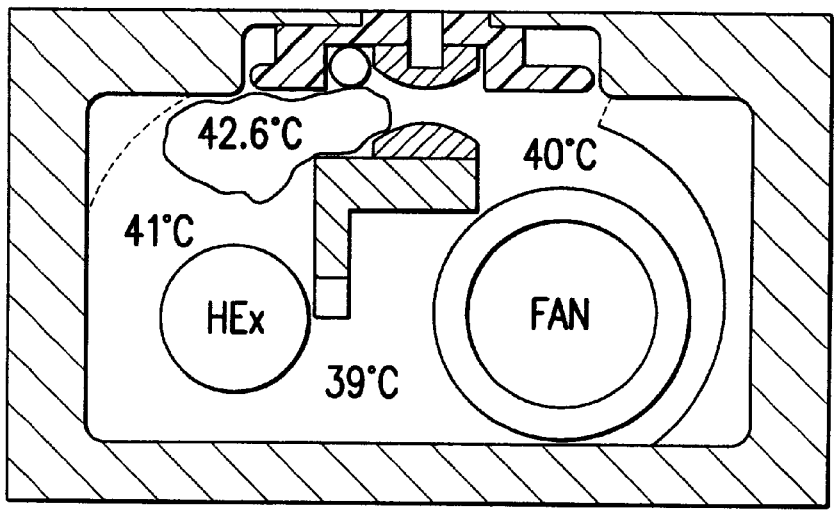
Figure 1D:
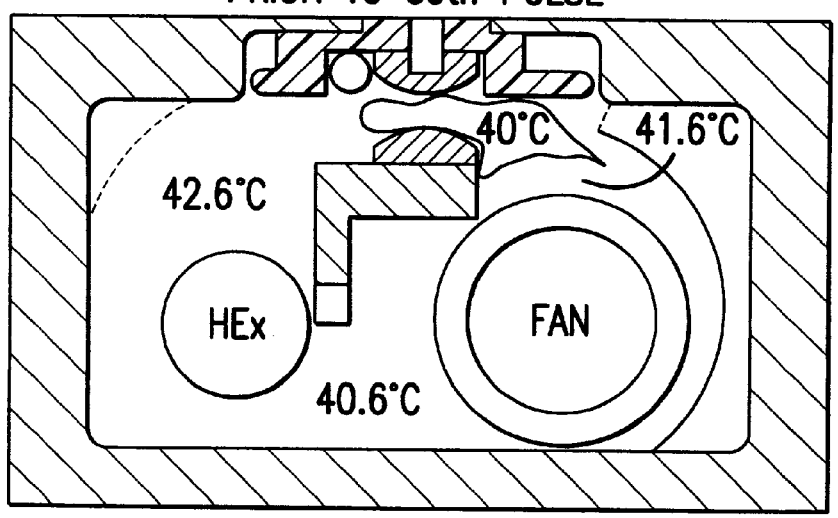
Figure 1E:
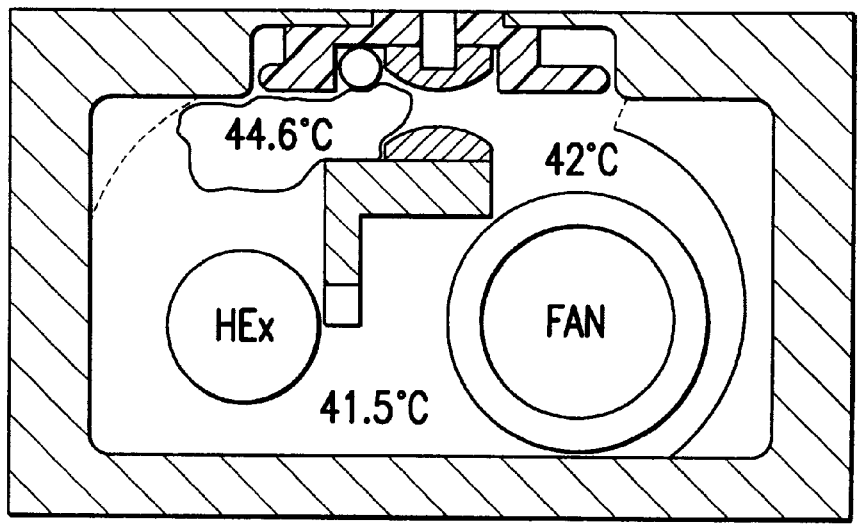

Controls on the laser cooling system are set to maintain average gas temperatures as closely as feasible to a constant temperature such as about 44° C. However, since heat is added periodically (during extremely short time periods) between the electrodes and removed at the heat exchanger, gas temperatures vary substantially within the chamber. For example, the gas temperature in the chamber prior to the first pulse of a 300 pulse burst after the 9 second down time will be relatively constant throughout the chamber at (for example) about 40° C. (with a small step temperature gradient across the heat exchanger). At this time heat is being extracted from the gas by heat exchanger 40 and added to the gas by the (at this time) somewhat warmer walls and other structures of the chamber. A rough estimate of the temperature distribution is shown in FIG. 1A. Just prior to the second pulse the gas temperature for a distance of about 4 cm downstream of the electrodes will be about 42° C. but the gas temperature upstream will continue to be about 40° C. as indicated in FIG. 1B. Just prior to the next approximately 40 pulses, the gas temperature between and upstream of the electrode will continue to be about 40° C. and the gas temperature downstream will continue to be about 42.6° C. but the volume of 42.6° C. will grow as the heated slugs of laser gas circulate around the laser. FIG. 1C shows a rough estimate of the gas temperature just prior to the fifth pulse. At about the 35$^{th}$ to 40$^{th}$ pulse the upstream temperature of the gas will begin to be affected by the first pulses of the burst and the upstream temperature will increase to about 42° C. as indicated in FIG. 1D. When the gas from the first pulse passes through the electrodes for the second time it will be about 2° C. higher at about 42° C. and will receive about the same amount of heat as the first burst and its temperature be increased to about 44.6° C. and for about 35 to 40 pulses the upstream and downstream temperatures will remain relatively constant at about 42° C. and 44.6° C. as indicated in FIG. 1E, after which both upstream and downstream will see another small incremental temperature increase. This process continues with the incremental increases becoming slightly smaller each approximately 40 pulses so that just prior to the last pulse of the first 300 pulse burst the upstream temperature is about 42° C. and the downstream temperature is about 44.6° C. Immediately following the first burst is a down time of 0.15 second during which time the laser gas temperature downstream of the electrode decreases to approximately the upstream temperature of about 42° C. and then over the next 0.15 seconds the average temperature of the gas is reduced by the heat exchanger by about 2° C. (The reader should keep in mind that the temperature changes shown qualitatively in FIGS. 1A through 1F occur very rapidly during one 300 pulse burst lasting only 0.15 second.)

The first pulse of the second burst will again cause an approximately 2.6° C. increase in a small volume downstream of the electrode which heated volume grows with each of the first few pulses of the second burst. The upstream temperature will again begin to increase about 35 to 40 pulses later as explained above with additional increases affected by the first pulses of the burst and the upstream temperature will increase to about 42° C. When the gas from the first pulse passes through the electrodes for the second time receiving about the same amount of heat as the first burst, it will be increased to about 44.6° C. and for about 35 to 40 pulses the upstream and downstream temperatures will remain relatively constant at about 42° C. and 44.6° C. after which both upstream and downstream will see another small incremental temperature increase. This process continues in the manner explained with respect to the first burst.

Figure 2B:
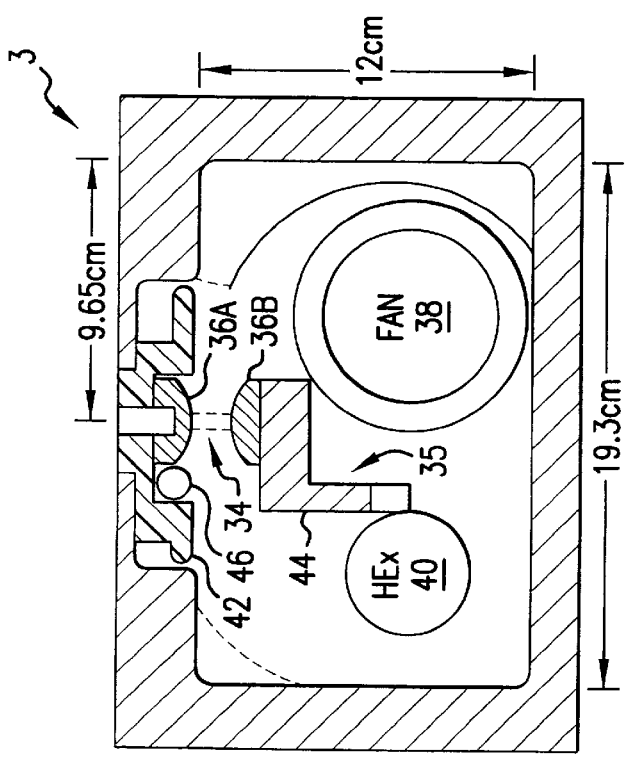
FIG. 2B shows the change in sound speed with temperature.
Figure 2A:
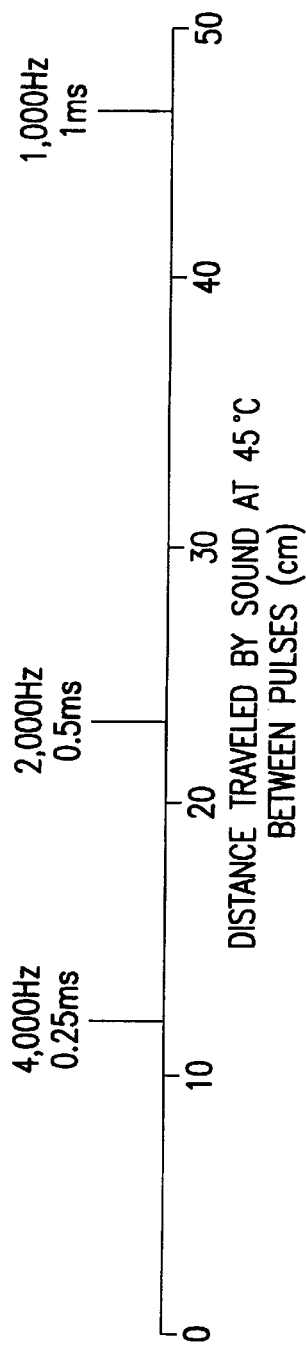
FIG. 2A shows distances traveled by sound between laser pulses at various pulse repetition rates.
Figure 2C:
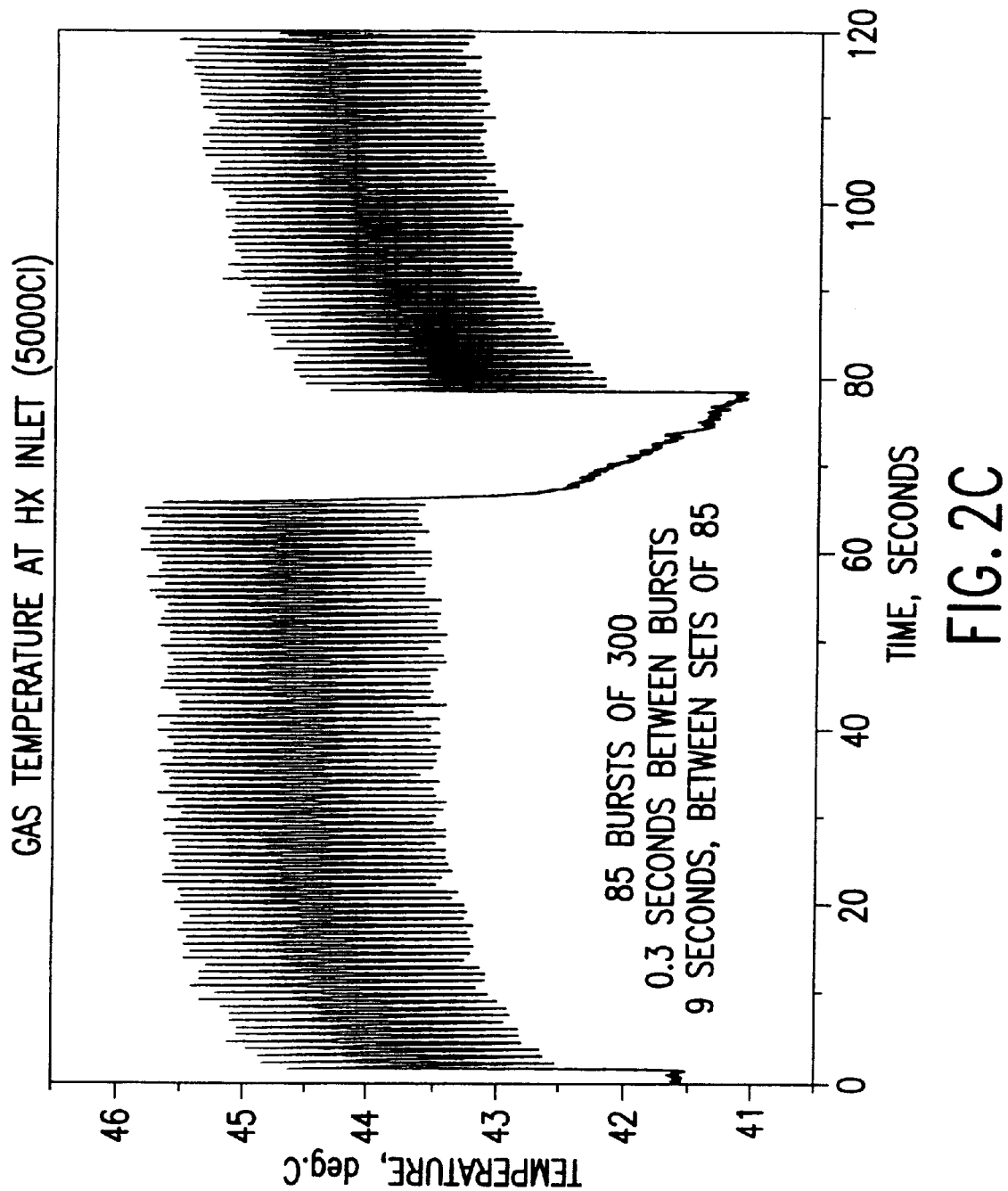
FIG. 2C is a chart showing temperature swings during pulse mode operation.

Similar temperature changes occur during each of the 170 bursts required to process a single wafer in a time period of about 51 seconds. During this time the average gas temperature will drift upward by about 3° C. and after the last pulse of the 170$^{th}$ burst there is a 9 second down time to change wafers when the average gas temperature drops about 5° C. to about 41° C. (where we started). FIG. 2C shows a temperature tracing of a very fast thermocouple-located just upstream of the heat exchanger in a laser being operated at 1000 Hz with 0.3 seconds between bursts and a down time of 9 seconds after 85 bursts.

Temperature Effects on Returning Pressure Wave Position

Thus, during a one minute cycle of operation of a lithography laser there are very rapid small incremental changes in the laser gas temperature. In the past these small temperature changes have not been considered particularly important because the changes were considered too small to have any direct effect on the discharge, the chemistry of the laser gas or the optical properties in the laser discharge region. Applicants have discovered, however, that these small temperature changes can have a very major indirect effect on laser beam quality due to the effect of temperature on the speed of discharge-caused pressure waves (sound and shock waves) in the laser when the laser is operated at very high repetition rates such as rates in excess of 1000 Hz. The relationship of the speed of sound in the KrF (mostly neon) laser gas with temperature is shown in FIG. 2B. The relationship is a square root relationship but it is almost linear in the operating range of the laser. From FIG. 2B, a 1° C. increase in the neon temperature increases the sound speed by about 0.8 m/s. Therefore, the approximately 3° C. increase in the downstream gas temperature occurring during the first approximately 5 milliseconds following the start of a burst will increase by about 2.4 m/second the speed at which the echo from the pressure wave of a particular pulse returns to the discharge region.

The time of return of pressure wave echoes can be very important since Applicants' tests have shown the pressure wave has a thickness (of the pressure front) of about 4 mm or about the thickness of the approximately 4 mm discharge region. The difference between the low pressure part of the wave and the high pressure part is about 0.03 to 0.07 atm or about 1 to 2% of the chamber pressure. If a pressure wave echoes back through the discharge region at any time other than during the approximately 40 ns time period of a subsequent pulse, it causes no problem. The problem is caused when a returning pressure wave in a high pulse rate laser from a particular discharge passes through the discharge region at the exact time of the subsequent pulse. If the echo pulse is exactly centered over the discharge region, the low pressure portion would be on one side of the region and the high pressure portion would be on the other. The result is a gas pressure such as 3.015 atm on one side of the discharge region and 2.985 atm on the other side.

The index of refraction of the mostly neon laser gas at 3 atm is about 1.000201. A 1% gradient in pressure across the discharge region would result in an index of about 1.000202 on one side of the region and 1.000200 on the other side. This would have the effect of changing the direction of the laser beam exiting the laser by about 2 milliradians. As indicated in the background section of this specification, a 2 milliradian change in direction would result in a change in the wavelength selected by the grating of about 2 pm. Thus, the 2 milliradian change could cause a 2 pm change in the selected wavelength.

Pulse Energy Chirp and Wavelength Chirp

For several years users of lithography excimer lasers have observed minor variations in laser beam parameters, especially pulse energy and wavelength, during burst mode operation. The largest of variations usually, but not always, occur at the beginning of a burst and/or at about one circulation time (about 30 ms for a 1000 Hz laser) after the start of a burst.

These "chirp" variations have seemed to follow patterns but the patterns were difficult to predict and were different for different laser chambers and operation conditions. There has been much speculation as to the cause or causes of these variations but no firm agreement as to the cause.

The energy chirp problem has been dealt with primarily in two ways with the laser energy control system. First, the energy control system is so fast that the pulse energy of a given pulse can be adjusted with a feedback technique based on the measured energy of earlier pulses including the immediately preceding pulse. Second, the computer controller has been taught to learn the pattern of the energy chirp and to make adjustments to the discharge voltage taking those patterns into consideration in order to produce the desired individual pulse energies and total "dose" energy in a burst. A process for processing active control of energy chirp is described in U.S. Pat. No. 6,005,879 which is incorporated herein by reference.

Active control of wavelength chirp is more difficult because the measurement of wavelength takes longer than the energy measurement and because currently used wavelength tuning mechanisms are slower than discharge voltage controls. Therefore, Applicants have devised methods of minimizing the chirp by modifications inside the laser chamber to reduce the impact of pressure waves crossing the discharge region.

How Much Difference A Degree Makes

Figure 1F:
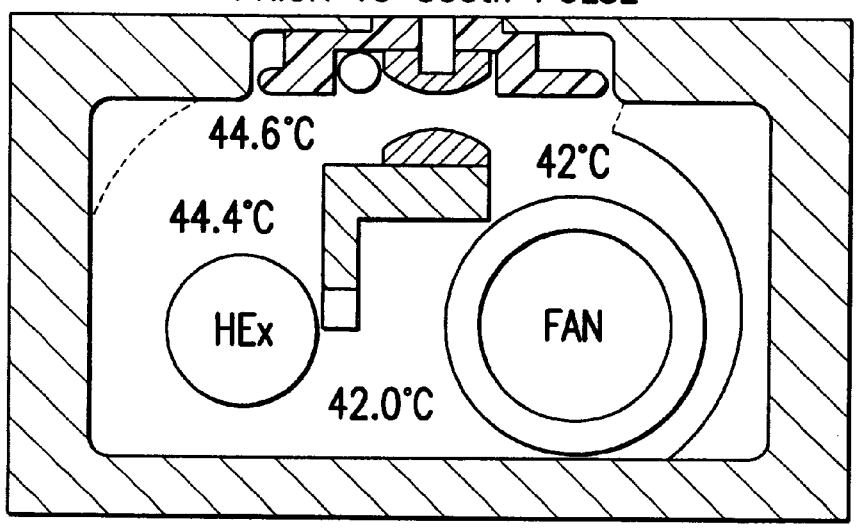
Figure 11A:
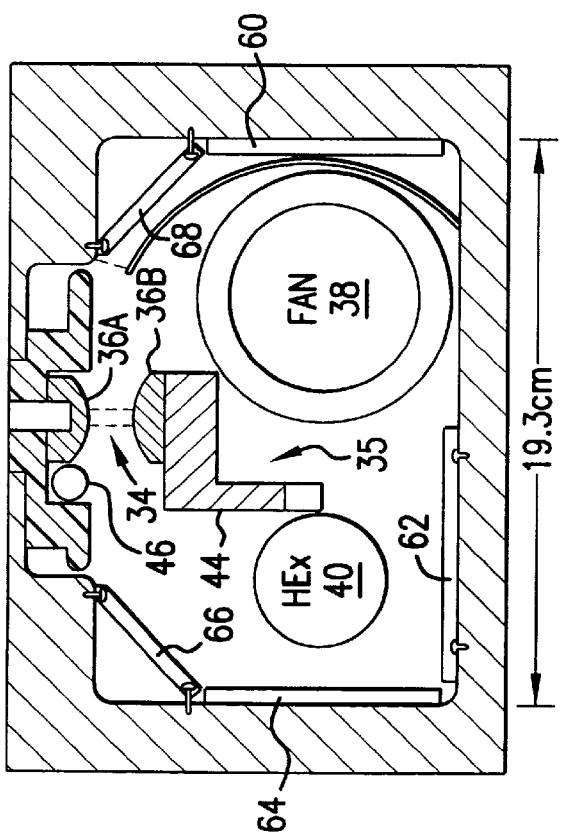

As shown in FIGS. 11A through 1F, temperature swings of about 2 to 3° C. occur in the laser gas on time scales of a few milliseconds, such as about 5 milliseconds. Chirp variations also are in the range of a few milliseconds. Suppose a laser is operating at a pulse frequency of 2000 Hz. The distance sound would travel in laser gas between pulses (466 m/s) at 45° C. is about 23.30 cm. The distance sound would travel in the laser gas between pulses (467.6 m/s) at 47° C. is about 23.38 cm. Therefore, if the laser gas downstream of the electrodes is at a temperature of 45° C. and the pressure wave returning from the immediately preceding pulse is located immediately downstream of the discharge region (and causing no perturbation of the beam) an increase in the gas temperature to 47° C. will position the edge of the pressure wave approximately 0.8 mm into the discharge region. Another 2° C. rise will move the edge of the wave almost to the middle of the discharge region.

Thus, at 2000 Hz, the position of returning pressure waves from the immediately preceding pulse is moved about 0.8 mm for each 2° C. of temperature change. At 1000 Hz the position of the pressure wave is moved about 0.8 mm for each 1° C. temperature change. For pressure waves returning from pulses earlier than the immediately preceding pulse the position change is proportionally larger.

Mitigation of Pressure Waves

Many techniques can be used to mitigate the effects of pressure waves. Several such techniques are described in U.S. Pat. No. 5,978,405 which has been incorporated herein by reference. These include angled reflectors, such as those shown in FIGS. 5A through 5D of that patent, positioned to reflect the pressure waves downward into the bottom of the chamber.

FIRST PREFERRED EMBODIMENT

Saw-Toothed Baffles with Varied Shaped Teeth

Figure 11B:
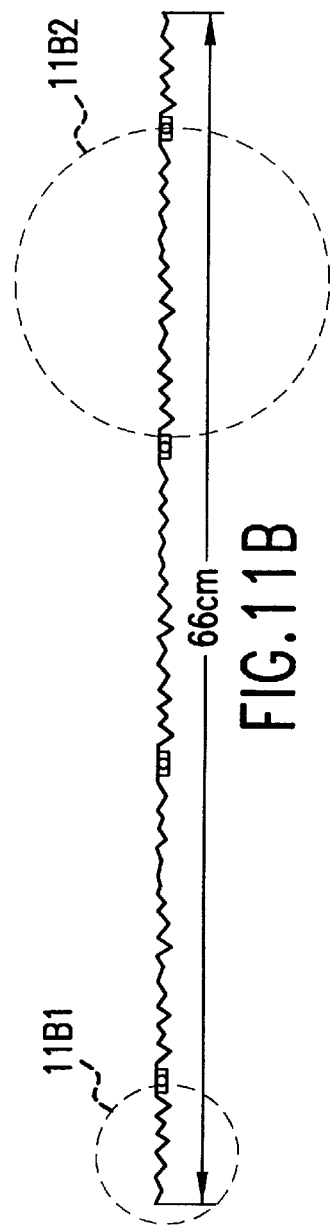

A first preferred embodiment of the present invention is shown in FIG. 11A and 11B. FIG. 11A shows a cross-section of a laser chamber with baffles attached by screws to the chamber walls at positions 60, 62, 64 and in the upper comers as shown at 66 and 68. The baffles have a cross section which is saw-tooth shaped with varying shaped teeth as shown in FIG. 11B which is an end view of baffle 60. As indicated in detail views of portions of baffle 60 (FIG. 11B1 and FIG. 11B2), the pitch of the teeth vary from 0.390 inch to 0.590 inch and the height of the teeth vary from 0.120 inch to 0.280 inch. The teeth are aligned generally in the direction of gas flow and perpendicular to the laser beam direction and the long dimension of the discharge region. In this preferred embodiment the baffled material is 20 gage nickel plated aluminum sheet. This baffle design is very effective in dispersing the discharge produced pressure waves. This design reflects the waves in a great number of directions with minimum reflection in directions perpendicular to the long direction of the discharge region. The result is that if and when acoustic energy from any particular pulse returns to the discharge region, the energy (or pressure perturbation) of the wave is fractionalized into a very large number of pieces.

Figure 3:
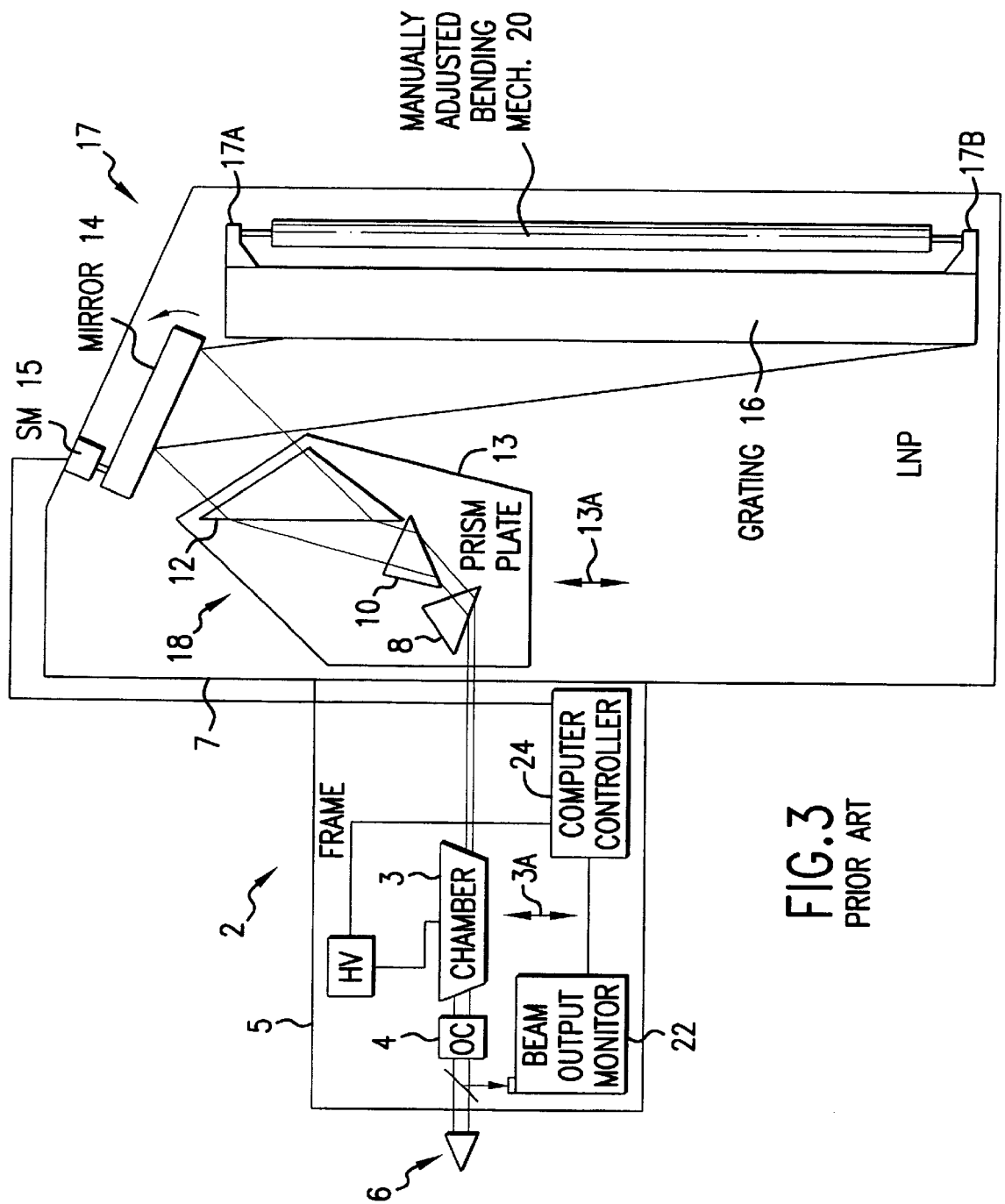
FIG. 3 shows how the wavelength of a lithography laser is controlled.

FIG. 11C1 through 11C4 show the results of tests conducted by Applicants in which Applicants lined the walls generally as shown in FIG. 11A with aluminum plate formed as generally shown in FIG. 11B but without the precision specified in FIG. 11B. The result from this test as shown in FIG. 11C2 is about a factor of two improvements in the wavelength perturbation as compared to the data shown in FIG. 11C1 which was obtained using a chamber of the design shown in FIG. 1 which include angled metal diffuser plates located in the comer above the heat exchanger and above the fan baffle. The only major perturbation occurs at about 1940 Hz. This large perturbation at about 1940 Hz was greatly reduced as shown in FIG. 11C3 by putting baffles generally shaped as shown in FIGS. 11B, 11B1 and 11B2 on the upper half of the downstream side walls as shown at 70 in FIG. 11D1. Further improvement resulted from mounting similar baffles (as shown in FIG. 11D2) 72 on the upstream side walls as shown in FIG. 11C4.

The reader should note that in FIGS. 11C1 through 11C4, wavelength transient data are plotted. These plotted values represent the difference between the average line center wavelength of the first 30 pulses and the average line center wavelength of the last 30 pulses of a 100 pulse burst. For this laser with the baffle arrangement described above and in FIG. 11C4, almost all of the data points fall within a range of about ±0.02 pm, an amazing improvement as compared to the data shown in FIG. 11C1. The reader should also note that the first thirty pulses (representing the first 15 milliseconds of the burst at 2000 Hz and the first 20 milliseconds the burst at 1500 Hz) are on the average at a wavelength about 0.026 pm lower than the equilibrium wavelength for the bursts. In general the normal burst pattern is for the wavelength to dip to a low point at about 7 to 10 ms after the start of a burst then increase gradually. After about 20 milliseconds, the centerline wavelength (on the average) is substantially at equilibrium (i.e., centered at 0.0 pm). The average could be shifted up to about zero by pretuning mirror 14 for the first approximately 7 to 10 milliseconds of a burst. Preferably, the wavelength controls for the laser could be programmed to learn, on an on-going basis, the best degree of pretuning.

Figure 12:
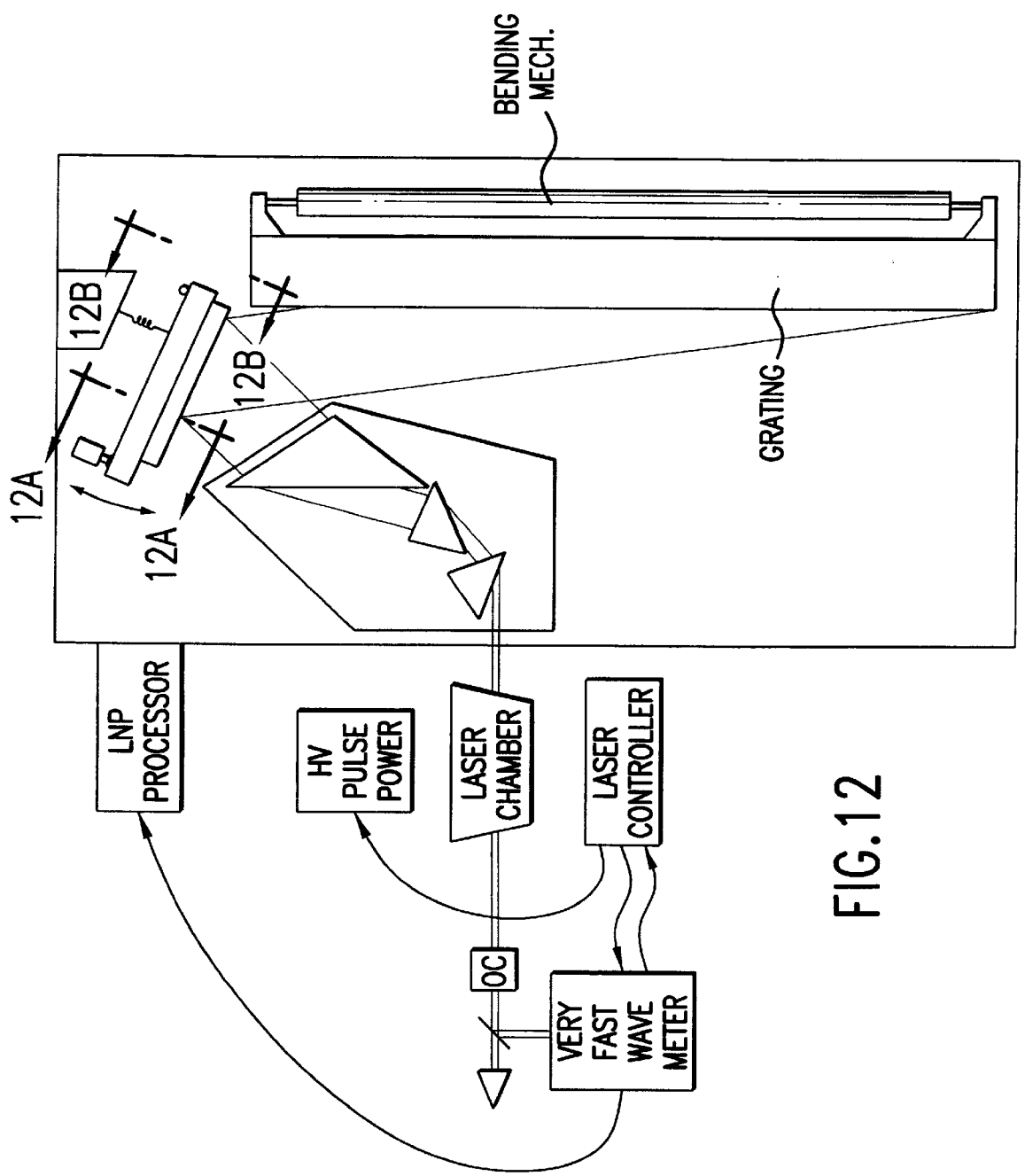
FIGS. 12, 12A and 12B show a proposed technique for providing faster and finer wavelength control.
Figure 12A:
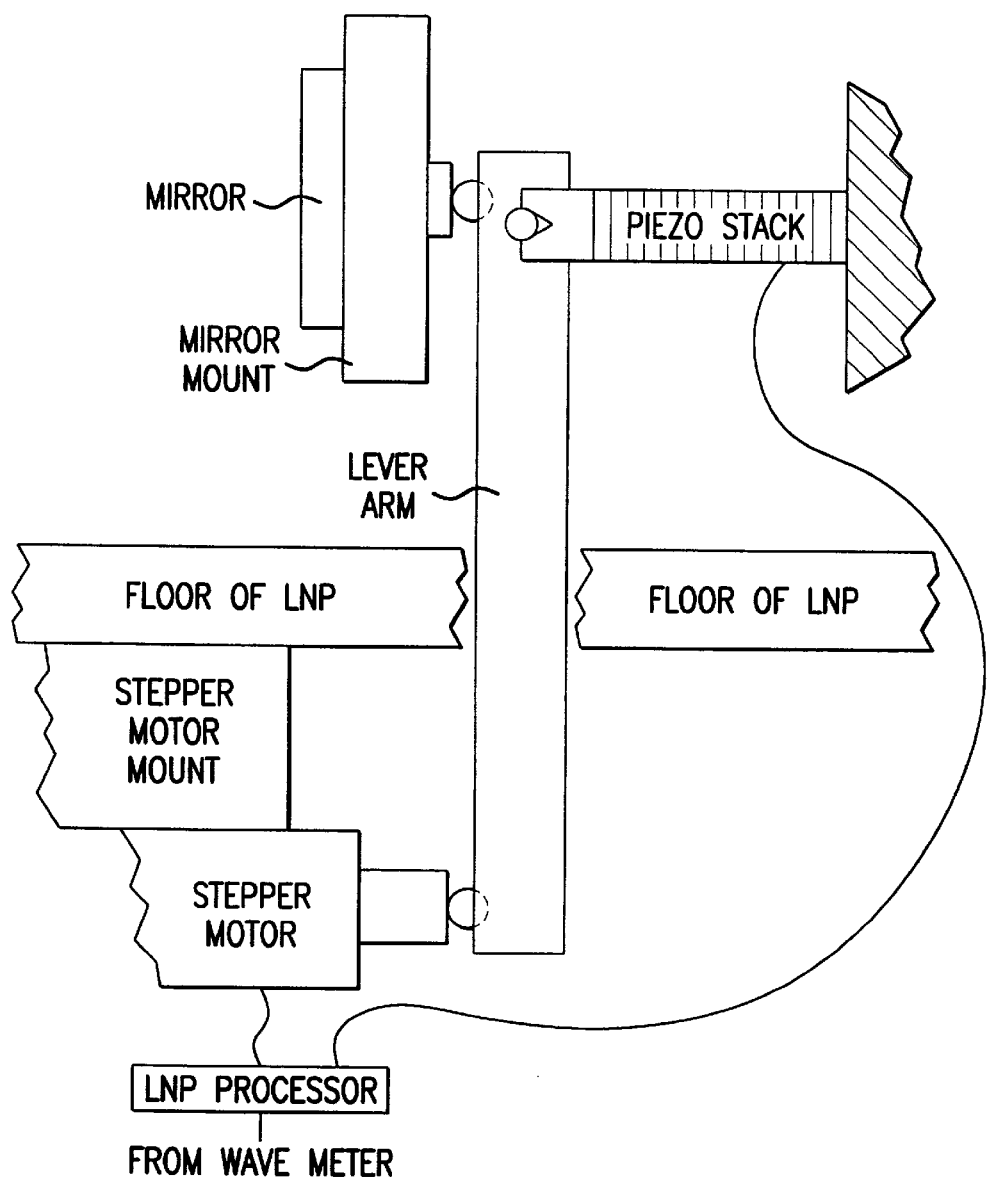
Figure 12B:
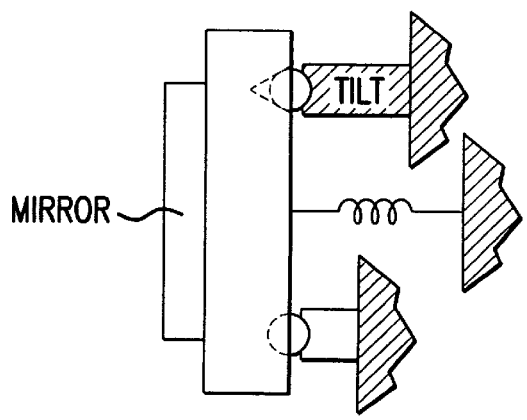

The smallest incremental movement available with prior art stepper motor 15 produces a centerline wavelength change of about 0.05 pm. For this particular laser an incremental change of 0.05 pm for the first 7 ms would increase the wavelength transient values to about zero on the average. Typical prior art tuning mirrors operate with a latency of about 5 to 7 milliseconds so that the laser controls could be programmed to order the mirror to return to its steady state position (the position for producing the desired centerline wavelength after about 30 ms into the pulse) about 5 to 7 milliseconds in advance. For best results mechanical and electrical improvements should be made to the prior art wavelength controls. For faster finer control a piezoelectric driver system could be added to the mirror drive which would provide the needed increase in speed and precession. A preferred design of tuning mirror drive system incorporating the prior art stepper motor arrangement with a piezoelectric assist for fast fine tuning is shown in FIGS. 12, 12A and 12B. With this arrangement, large slower changes in wavelength are provided with the stepper motor and small fast changes are provided with the piezostack.

THIRD PREFERRED EMBODIMENT

$Al_2O_3$ Fibers in Wire Mesh Holder

Figure 10A:
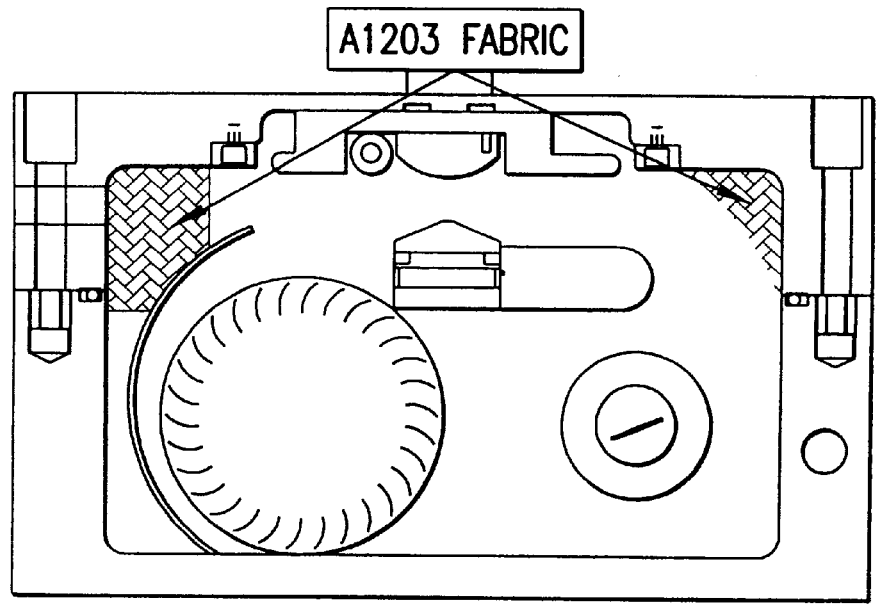
FIGS. 10A and 10B demonstrate the effects of a pressure wave absorber on beam quality.
Figure 10B:
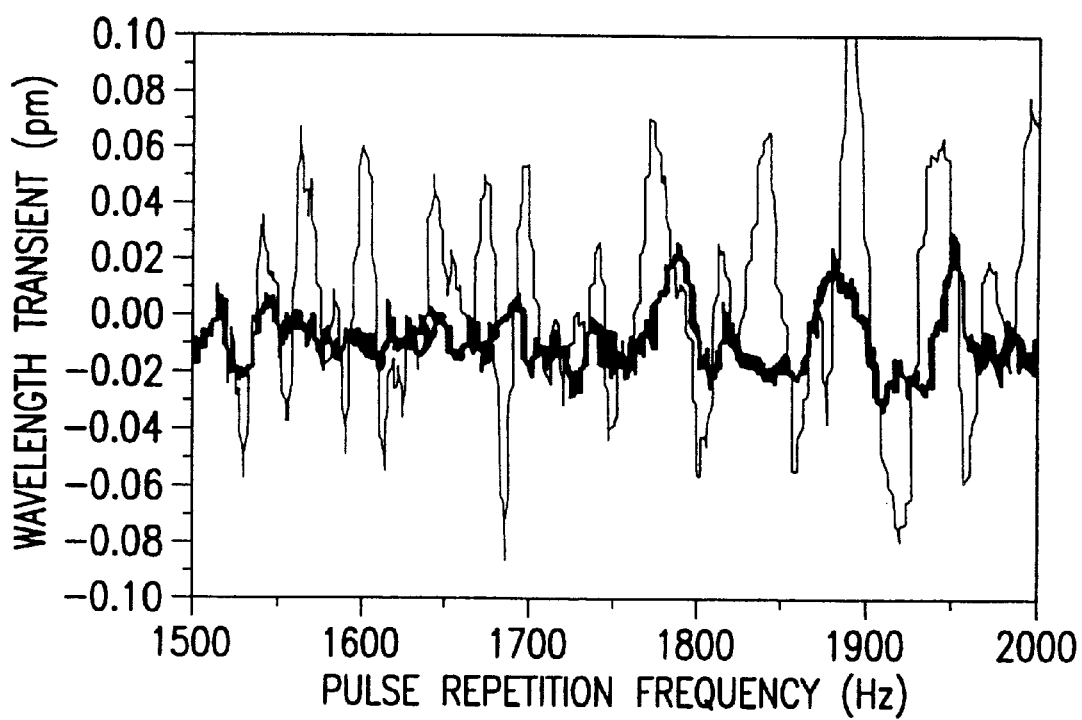

A preferred embodiment of the present invention utilizes pressure wave absorbers consisting of unwoven loosely packed aluminum oxide ($Al_2O_3$) fibers contained in wire mesh holders forming containers having the cross sectional shapes shown at 50 and 52 in FIG. 10A. These holders run the length of the chamber. The fibers are Part Number Al 633790 supplied by Goodfellow Corporation with offices in Berwyn, Pa. Approximately 60 gm of the material was placed as shown in FIG. 10A. The wire mesh is aluminum wire mesh formed of 1 mm diameter wire with a 1 cm grid. The material was tested by operating a KrF laser through pulse frequency range of 1500 Hz to 2000 Hz and comparing the results to similar data using the same chamber with comer reflections of the type shown in FIG. 1. The anode support bar was modified as compared to the FIG. 1 anode support bar mainly to improve gas flow. The results are compared in FIG. 10B. The transient data is shown by the thick line compared to the prior art data shown by the thin line. The $Al_2O_3$ fibers greatly reduce the wavelength transient effect.

Another absorbing non-woven fabric material which could be used is comprised of zirconia and 8 percent yttrium. Since these materials provide very large surface area attack by fluorine is a patented problem so that it is important that the fibers have resistance to fluorine attack. Another possibility is to collect the fibers inside a very thin bag that will transmit the pressure wave but keep the fluorine away from the fibers.

Mitigation with Temperature In Mind

The important new discovery of this invention is the effect of temperature changes in changing the positions of pressure waves bouncing around the chamber. For example, if the gas temperature conditions could be held constant the pressure waves would not be a serious problem. Even if a returning wave for every pulse were centered directly over or partially over the discharge region, all it would do is affect the index of refraction of the gas in the discharge region. This would produce a slight angling of the beam heading to the LNP and unless corrected this angling of the beam would affect the output wavelength. However, a constant angling of the beam would be automatically corrected for by the normal feedback controls on the laser which would merely adjust the position of tuning mirror 14 to produce the desired wavelength. Thus, it is the rapidly changing laser gas temperature that rapidly changes the positions of the pressure waves that causes the problem.

Methods for Keeping Temperature Constant

The problem of wavelength chirp can be corrected by keeping the gas temperature constant. This can easily be done by operating the laser continuously. At continuous operation, chirp goes away. The problem with this approach is that integrated circuit fabricators do no want to operate their lasers continuously. Continuous operation would substantially increase operating costs. Continuous operation is not a desirable solution to wavelength chirp, but it is a solution which generally significantly improves beam quality.

Continuous Operation

Since the downtime between bursts is about equal to the length of the burst, it might be economical to use one laser operating continuously as the light source for two stepper or scanner machines. This would require a fast optical switch for switching the laser output beam between the two lithography machines and would greatly complicate operation but in some very automated situation such an arrangement might be cost effective. One technique for fast switching of laser beams is described in U.S. Pat. No. 5,852,621. An advantage of this arrangement (to be weighed against the many serious disadvantages) is that beam quality could be optimized based on the continuous operation of the laser.

Figure 14:
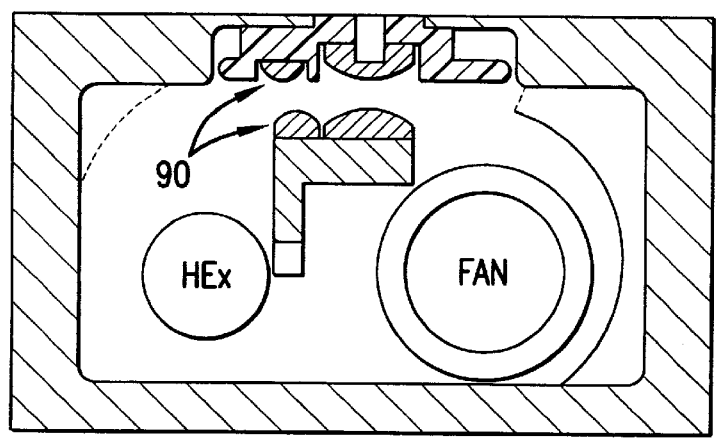
FIG. 14 shows a technique for providing heat at fast rates to the laser gas during laser down times.

An alternative to continuous operation is to provide a heat source near the electrodes to add heat to the gas when the laser is not firing. This would need to be a very fast heat source since the temperature cycles are in the millisecond range. One approach would be to install electrodes 90 just downstream of the existing electrodes as shown in FIG. 14 that would provide only heat and no lasing. Other very fast acting heaters available on the market could be used to minimize the temperature transients.

Another approach is to provide a passive heat sink with very large surface area preferably just downstream of the electrodes. This heat sink would absorb heat from the gas when the laser is lasing and would add heat to the gas during down times. This would have the affect of substantially reducing the temperature swings during burst mode operation and thus reduce the changes in the distance the reflecting pressure waves travel. The non-woven fibers referred to above placed in the chamber mainly to absorb the pressure waves provide the added benefit of moderating the temperature swings. The mass of the fibers is about 60 gm compared with about 50 gm of laser gas and the specific heat of $Al_2O_3$ is greater than the specific heat of the laser gas. Heat is transferred very rapidly between the fibers and the gas when there is a temperature difference, so the fibers tend to moderate the temperature swings (such as those shown in FIG. 2G) inside the laser chamber.

Spatially Varying Temperatures

Figure 13:
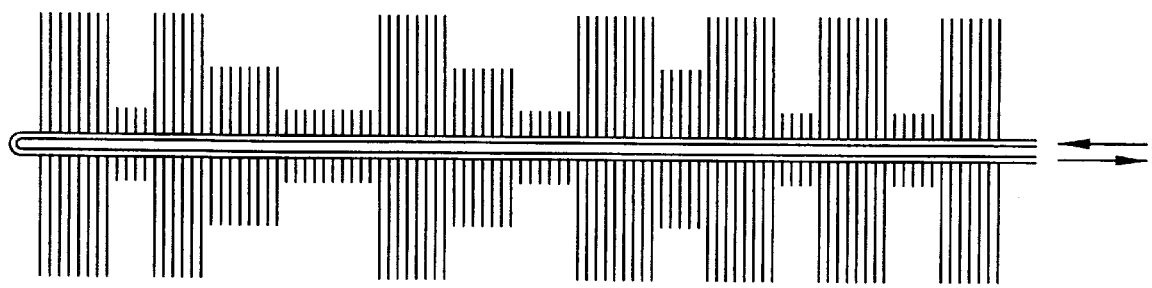
FIG. 13 show a heat exchanger design for producing differing laser gas temperature regions in the laser chamber.

Another method of dispersing the pressure waves to improve variations in the gas temperature in the direction of the long dimension of the discharge region. One easy way to do this is to use a one pass water cooled heat exchanger with a water flow rate low enough to produce a substantial gradient across the length of the chamber. For example, a water flow rate of about 6l/ m will produce a $\Delta T$ of about 40° C. This 40° C. gradient will be substantially picked up by the laser gas the result in that the earliest reflections at one end of the chamber arrive back at the discharge region about 1.5 cm ahead of the earliest reflections at the other end. Another approach is to vary the size of the heat exchange fins along the length of the heat exchange so as to create several regions of different temperature along the length of the chamber to help fractionalize the pressure waves returning to the discharge region. A preferred design is shown in FIG. 13. The heat exchanger should be designed to produce temperature variations from region to region of at least 10° C. As indicated above, at 2000 Hz a reflecting wave will be delayed at least about 0.8 mm for each 2° C. temperature decrease so reflections from the hotter regions will mostly (at least) pass through the discharge region before a sibling wave from a 10° C. colder region arrives at the discharge region. Another approach is to provide the same size fins along the length of the heat exchange but insulate sections of the fins from the cooling water tube so that these fins act as passive heat sinks tending to hold a region of the flow at time averaged temperatures.

Various modifications may be made to the invention without altering its scope. All of the above are just examples of the present invention. Those skilled in the art will readily recognize that numerous other modifications and alterations may be made without departing from the spirit and scope of the invention. Accordingly, the above disclosure is not intended to be limiting and the scope of the invention is to be determined by the appended claims.

We claim:

1. An electric discharge laser with wavelength chirp mitigation comprising:
   A) a laser chamber,
   B) an elongated electrode structure enclosed within said chamber comprising an elongated anode and an elongated cathode separated by a distance defining a discharge region, said discharge region defining a long dimension in a beam direction,
   C) a laser gas contained in said chamber,
   D) a fan for circulating said laser within said chamber and through said discharge region, and
   E) at least one baffle for preventing temperature caused changes in the arrival times within the discharge region of reflected discharge caused pressure waves, said baffle defining a saw-tooth shaped cross section, with saw-teeth of varying shapes and having pitches ranging from about 0.390 inch to about 0.590 inch with teeth heights ranging from about 0.120 inch to about 0.280 inch wherein the saw-teeth are aligned generally in directions perpendicular to the beam direction.

2. A laser as in claim 1 wherein said saw-tooth shaped cross section is machined in walls of said chamber.

3. A laser as in claim 1 wherein said baffle is comprised of nickel coated aluminum.

4. A laser as in claim 1 wherein said baffle is comprised of metal acoustic diffuser plate.

5. A laser as in claim 1 and further comprised of a heat exchanger configured to produce a temperature gradient in the laser gas in the beam direction of at least 40° C.

6. A laser as in claim 1 wherein said mitigation means comprises a heat exchanger configured to produce laser gas temperatures in said chamber which vary along the beam direction in increasing and decreasing increments of at least 10° C.

7. A laser as in claim 1 wherein said mitigation means comprises a fast acting gas heater system positioned apply heat to the laser gas during laser down times approximately equal to heat added to the gas by discharges between the electrodes when the laser is operating.

8. A laser as in claim 1 programmed to operate continuously at a repetition rate in excess of 1000 Hz configured to function as a light source for at least two separate stepper or scanner system providing bursts of pulses alternatively to the two systems.

9. A laser as in claim 8 wherein said at least two separate stepper or scanner systems are part of a single stepper or scanner machine.

* * * * *